US006313043B1

(12) United States Patent
Hattori

(10) Patent No.: US 6,313,043 B1
(45) Date of Patent: Nov. 6, 2001

(54) MANUFACTURE OF FIELD EMISSION ELEMENT

(75) Inventor: Atsuo Hattori, Hamamatsu (JP)

(73) Assignee: Yamaha Corporation, Tokyo (JP)

( * ) Notice: Subject to any disclaimer, the term of this patent is extended or adjusted under 35 U.S.C. 154(b) by 0 days.

(21) Appl. No.: 09/460,364

(22) Filed: Dec. 13, 1999

(30) Foreign Application Priority Data

Dec. 14, 1998 (JP) ........................................ 10-354849

(51) Int. Cl.[7] ........................................ H01L 21/302

(52) U.S. Cl. ........................ 438/745; 438/747; 438/750; 438/754; 438/756

(58) Field of Search ........................ 438/745, 747, 438/750, 754, 756, 724, 733

(56) References Cited

U.S. PATENT DOCUMENTS 5,334,908 * 8/1994 Zimmerman ........................ 313/316
5,371,041 * 12/1994 Liou et al. ........................ 438/653
5,599,749 * 2/1997 Hattori ........................ 216/11
5,880,554 * 3/1999 Liu ........................ 313/309

FOREIGN PATENT DOCUMENTS 10-188786 7/1998 (JP) .

OTHER PUBLICATIONS

"Novel Single–and Double–Gate Race–Track–Shaped Field Emitter Structures," IEEE, 0–7803–3393–4, IEDM 96–313, Wang et al., 1996.

* cited by examiner

*Primary Examiner*—Benjamin L. Utech
*Assistant Examiner*—Binh X. Tran
(74) *Attorney, Agent, or Firm*—Ostrolenk, Faber, Gerb & Soffen, LLP

(57) ABSTRACT

A method of manufacturing a field emission element including the steps of: depositing an emitter electrode film on the surface of an emitter portion forming recess formed on a substrate; forming an emitter portion of an emitter electrode by removing the emitter electrode film deposited on the bottom of the emitter portion forming recess; depositing a sacrificial film on the surface of the emitter electrode and on the bottom of the emitter portion forming recess, and thereafter depositing a second gate electrode film on the surface of the sacrificial film. With this manufacture method, field emission elements having small unevenness in vertical positions of emitter and gate electrodes can be formed.

20 Claims, 28 Drawing Sheets

$\tan\Delta\theta 1 = D2/D1$

MANUFACTURE OF FIELD EMISSION ELEMENT

This application is based on Japanese patent application No. 10-354849 filed on Dec. 14, 1998, the entire contents of which are incorporated herein by reference.

BACKGROUND OF THE INVENTION a) Field of the Invention

The present invention relates to a manufacture method for a field emission element, and more particularly to a method of manufacturing a field emission element having a field emission cathode from the tip of which electrons are emitted.

b) Description of the Related Art

A field emission element emits electrons from a sharp tip of an emitter (electron emission cathode) by utilizing electric field concentration. For example, a flat panel display can be structured by using a field emitter array (FEA) having a number of emitters disposed on a support substrate. Each emitter controls the luminance of a corresponding pixel of the display.

In a field emission element, a gate electrode biased to a positive potential relative to an emitter is disposed near the emitter. This gate electrode applies an electric field to the tip of the emitter to emit electrons from the emitter.

Another gate electrode (converging electrode) is provided, if necessary, to converge electrons emitted from the emitter. When a negative potential is applied to this electrode, a repulsion force is exerted upon electrons emitted from the emitter and converges the electrons.

Wang et. al., "Novel Single- and Double-Gate Race-Track-Shaped Field Emitter Structures", Proc. IEDM, 1996, pp. 313–316 discloses a race-track-shaped field emission element having two laterally disposed gate electrodes (double gate).

FIG. 21 is a cross sectional view of a race-track-shaped field emission element having two laterally disposed gate electrodes. A post gate 100 in a central area applies an electric field to the tip of an emitter electrode 101 to emit electrons from the emitter electrode 101.

An outer second gate electrode 102 is provided to increase the intensity of the electric field near the tip of the emitter electrode 101 to lower the threshold voltage (at which the emitter electrode starts emitting electrons) between the post gate electrode and emitter electrode. With the element having such a structure, the distance between the emitter electrode and each gate electrode is determined by the thickness of each of insulating films 103 and 104 made of, for example, $SiO_2$. Since the area of the emitter electrode is large, the density of emission current per unit area is small.

The vertical height of the emitter electrode 101 is susceptible to change greatly depending on etching time and etching conditions. If the unevenness in the vertical heights of emitter electrons of manufactured elements is large, the performances of manufactured elements become very different.

SUMMARY OF THE INVENTION

It is an object of the present invention to provide a manufacture method for a field emission element having a two-stage gate structure, capable of suppressing unevenness in vertical positions of the emitter electrode and gate electrodes.

It is another object of the present invention to provide a manufacture method for a field emission element capable of sharpening the tip of the emitter electrode.

It is still another object of the present invention to provide a manufacture method for a field emission element capable of easily controlling the vertical positions of first and second gate electrodes relative to the emitter electrode.

According to one aspect of the present invention, there is provided a method of manufacturing a field emission element, comprising the steps of: (a) forming a stacked layer on a substrate, the stacked layer including a first gate electrode with a gate hole and an insulating film with a hole communicating with the gate hole; (b) forming a side spacer made of insulating material on side wall of the gate hole and the hole to form an emitter portion forming recess, the emitter portion forming recess having a bottom defined by a surface of the substrate exposed via the gate hole and the hole and a side wall surface wholly or partially defined by a surface of the side spacer; (c) depositing an emitter electrode film covering a surface of the emitter portion forming recess and an upper surface of the stacked layer; (d) forming an emitter electrode having an emitter portion by removing the emitter electrode film on the bottom of the emitter portion forming recess, the emitter portion being made of the emitter electrode film deposited on the side wall surface of the emitter portion forming recess; (e) depositing a sacrificial film on a surface of the emitter electrode and on a bottom of the emitter portion forming recess; (f) depositing a second gate electrode film on a surface of the sacrificial film; and (g) exposing the gate hole and the emitter portion and removing a portion of the sacrificial film deposited on the surface of the emitter portion forming recess.

The emitter electrode film is deposited on the surface, including a side wall surface, of the emitter portion forming recess formed on and above the substrate. The annular emitter portion of the emitter electrode is formed by removing the emitter electrode film on the bottom of the emitter portion forming recess. Thereafter, the sacrificial film is deposited on the surface of the emitter electrode and on the bottom of the emitter portion forming recess, and then the second gate electrode film is formed on the surface of the sacrificial film.

The emitter portion forming recess can be formed by forming on the substrate the stacked layer of the first gate electrode with the gate hole and the insulating film with a hole communicating with the gate hole, and by forming the side spacer made of insulating material on the side walls of the gate hole and hole.

By forming the first gate electrode, emitter electrode and second gate electrode by the method described above, unevenness in vertical positions of manufactured emitter electrodes (emitter portions) and second gate electrodes can be suppressed. It becomes easy to control the vertical positions of the first and second gate electrodes relative to the emitter electrodes (emitter portions). Accordingly, manufacture yield can be improved, degree of design freedom can be increased, and optimization can be made easy.

According to embodiments of the invention, it is easy to sharpen the tip of the emitter electrode, so that the current quantity per unit area can be increased.

If the sacrificial film or insulating film between the emitter electrode and second gate electrode is formed by sputtering or evaporation providing poor step coverage than thermal CVD, it is possible to lower the electric capacitance between the emitter electrode and second gate electrode, and so the dielectric breakdown voltage can be raised. If the emitter electrode film is formed by sputtering or evaporation providing poor step coverage, the emitter tip can be made more sharp and the emitter wiring resistance can be lowered.

According to embodiments of the invention, expensive photo processes are used less and the manufacture cost can be lowered. High throughput and yield can be achieved. Specifically, the first gate can be formed by one photo process, and the emitter electrode and second gate electrode can be formed by an etch-back process.

DETAILED DESCRIPTION OF THE PREFERRED EMBODIMENTS

FIGS. 1A to 1I are cross sectional views illustrating the manufacture steps of a field emission element according to the first embodiment of the invention. In the following, the manufacture steps of a two-electrode element having an emitter (field emission cathode) and a gate will be described. The two-electrode element has an emitter for emitting electrons and a gate electrode for controlling an electric field. The two-electrode element of the embodiment has a first gate electrode to be used as a converging electrode and a second gate electrode to be used as an ordinary gate electrode.

The second gate electrode is applied with a positive (+) potential relative to the emitter potential (1). The second gate electrode increases the intensity of an electric field near the tip of the emitter electrode to attract electrons from the emitter electrode. The converging electrode or first gate electrode is applied with a negative potential. The electric field generated by the first gate electrode exerts a repulsion force upon electrons emitted from the emitter electrode so that they are converged. In the following description, the first gate electrode is intended to mean the converging electrode and the second electrode is intended to mean the electrode which functions as in the above manner.

Figure 1A:
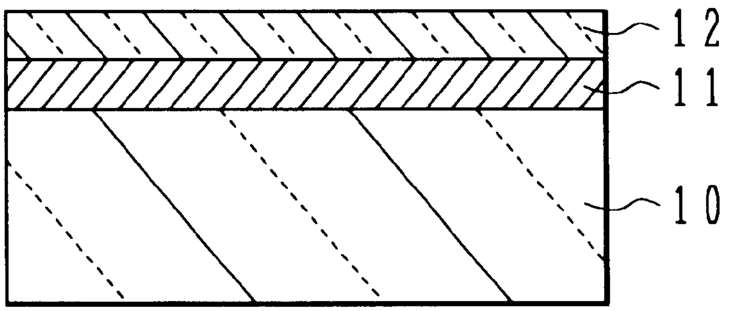
FIGS. 1A to 1I are cross sectional views of a substrate illustrating the manufacture steps of a two-electrode field emission element according to a first embodiment of the invention.

As shown in FIG. 1A, a first gate electrode film 11 is formed on a substrate 10. The substrate 10 is a single-layer substrate made of, for example, glass, quartz or the like, or a stacked-layer substrate made of an Si substrate on which a silicon oxide film is stacked. The first gate electrode film 11 is formed by depositing an Si film doped with P (phosphorous) or B (boron) to a thickness of 0.15 $\mu$m by low pressure CVD.

For example, this Si film is formed under the conditions of a substrate temperature of 625° C. and a reaction chamber pressure of 30 Pa while source gas of $SiH_4$ diluted with He is introduced into the reaction chamber. In order to lower the resistance of the Si film, P, B or the like is doped through diffusion or ion implantation.

As also shown in FIG. 1A, a first insulating film 12 is formed on the first gate electrode film 11. For example, an Si oxide film is deposited on the first gate electrode film 11 to a thickness of 0.15 $\mu$m at a substrate temperatures of 400° C. by using $O_3$ and TEOS as source gas.

Next, a resist film (not shown) having a predetermined pattern is formed on the first insulating film 12 through photolithography. By using this resist film as a mask, the first insulating film 12 and first gate electrode film 11 are anisotropically etched.

Figure 1B:
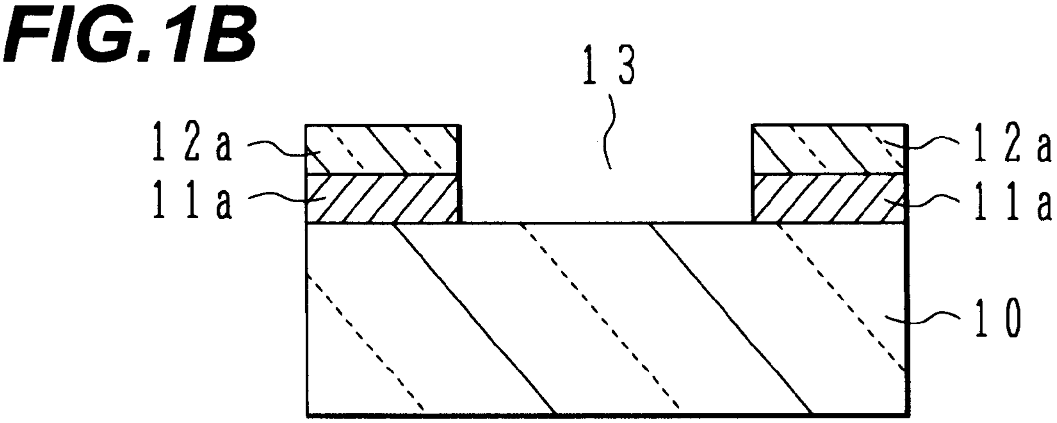

As shown in FIG. 1B, a first insulating film 12*a* and a first gate electrode 11*a* having a predetermined pattern and a recess 13 are therefore left. The recess 13 has a generally vertical wall whose plan shape (as viewed downward) is a circle of 0.6 $\mu$m diameter and height is about 0.3 $\mu$m. A portion of the recess 13 corresponding to the first gate electrode 11*a* forms a gate hole.

Figure 1C:
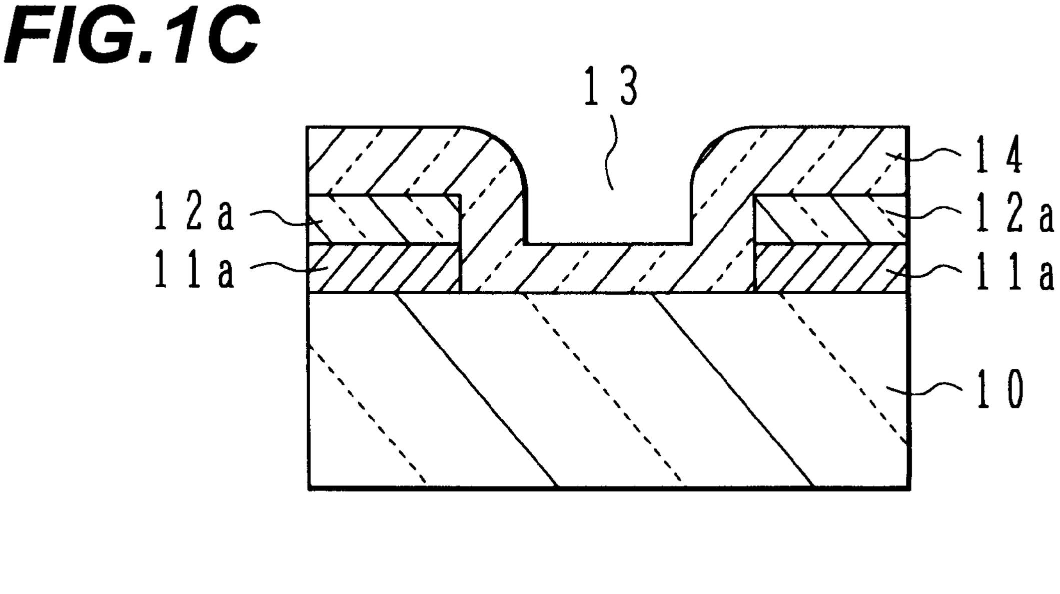

Next, as shown in FIG. 1C, an Si oxide film is deposited on the first insulating film 12*a* and recess 13 to a thickness of 0.2 $\mu$m through atmospheric pressure CVD to form a first sacrificial film (insulating film) 14. For example, the first sacrificial film 14 of Si oxide film is formed under the conditions of a substrate temperature of 400° C. and source gas of $O_3$ and TEOS.

Next, the first sacrificial film 14 is anisotropically dry etched (etched back).

Figure 1D:
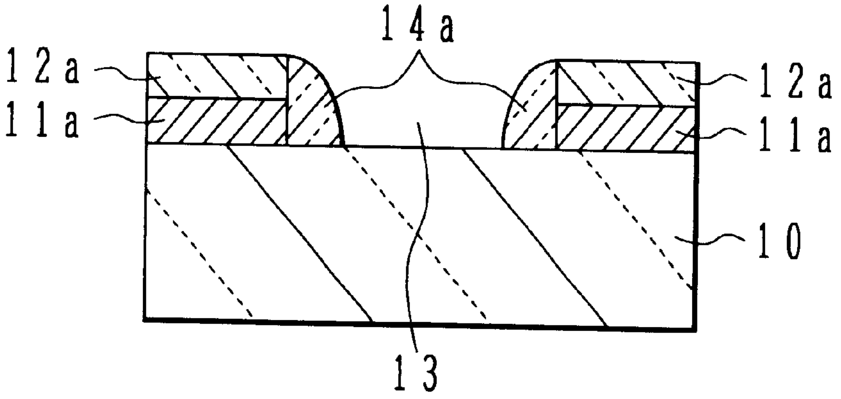

As shown in FIG. 1D, a portion of the first sacrificial film 14 is therefore left on the side wall and partial bottom surface of the recess 13, as a side spacer 14*a*.

For example, this etch-back is performed by using a magnetron RIE system under the conditions of a reaction chamber pressure of 50 mTorr and etching gas of $CHF_3$+$CO_2$+Ar.

Figure 1E:
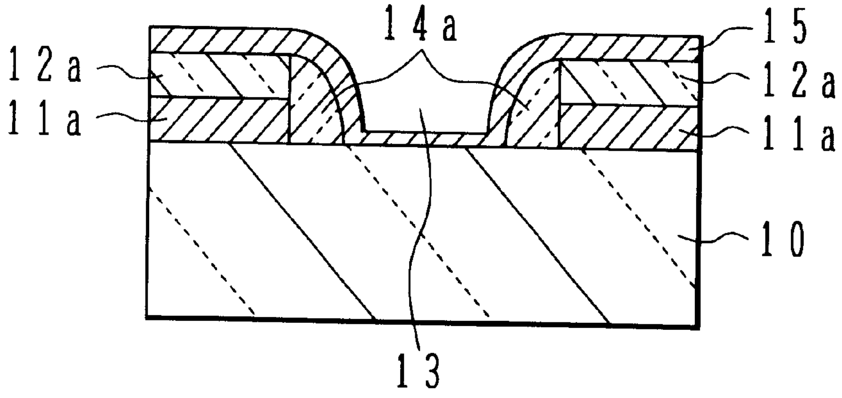

Next, as shown in FIG. 1E, an emitter electrode film 15 made of, for example, $TiN_x$, is deposited to a thickness of 0.1 μm (as measured relative to the first insulating film 12*a*) through reactive sputtering, on the surfaces of the substrate 10 exposed at the bottom of the recess 13, of the side spacer 14*a* and of the first insulating film 12*a*. This reactive sputtering is performed by using a DC sputtering system and Ti as a target while gas of $N_2$+Ar is introduced. The emitter electrode film 15 is therefore formed on the surfaces of the substrate 10, side spacer 14*a*, and first insulating film 12*a*, inheriting the surface topology of these. The emitter electrode film 15 is thick on the upper flat surface of the first insulating film 12*a*, and gradually thins toward the substrate 10 in the recess 13. Since the diameter of the recess 13 is relatively smaller than the height of the recess 13, the emitter electrode film 15 at the bottom of the recess 13 is thin.

Figure 1F:
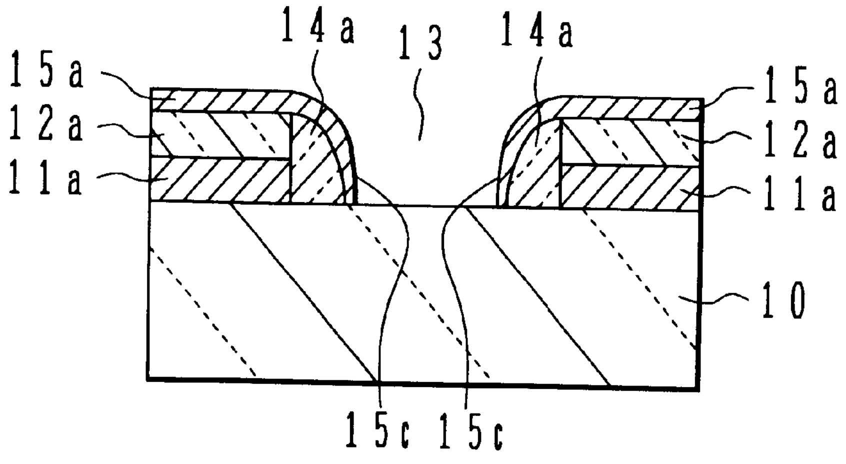

Next, as shown in FIG. 1F, the whole area of the emitter electrode film is etched back by about 0.05 μm to completely remove it on the bottom of the recess 13 and leave it on the first insulating film 12*a* and side wall of the recess 13 as an emitter electrode 15*a*. For this etch-back, anisotropical dry etching is performed. For example, it is performed by using a magnetron RIE system at a reaction chamber pressure of 125 mTorr by using $Cl_2$ as etching gas. A portion of the emitter electrode 15*a* formed on the side spacer 14*a* is hereinafter called an "emitter portion 15*c*".

Figure 1G:
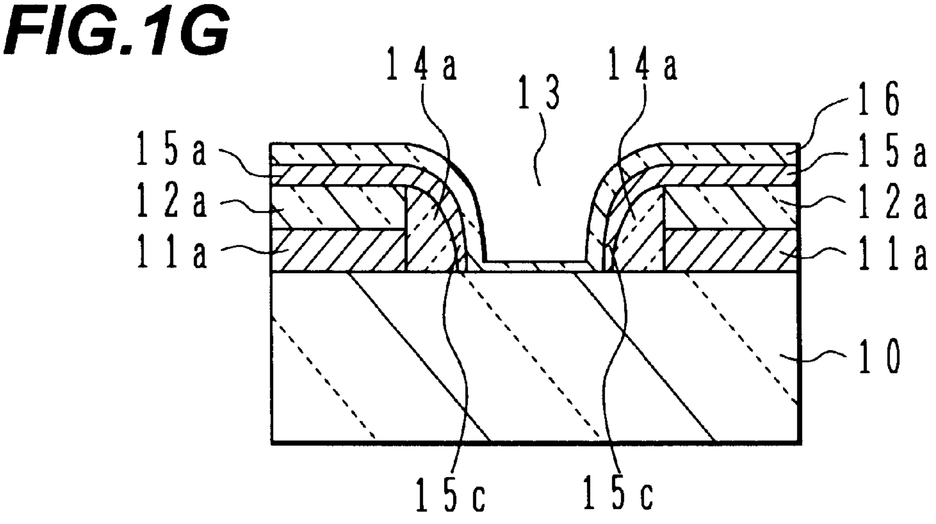

Next, as shown in FIG. 1G, a second sacrificial film (insulating film) 16 made of Si oxide film is deposited on a whole surface of the substrate to a thickness of 0.15 μm by atmospheric pressure CVD. For example, this film is formed under the conditions of source gas of $O_3$ and TEOS and a substrate temperature of 400° C. The second sacrificial film 16 is deposited on the surfaces of the substrate 10 exposed at the bottom of the recess 13 and of the emitter electrode 15*a*, inheriting (conformal to) the surface topology thereof.

Figure 1H:
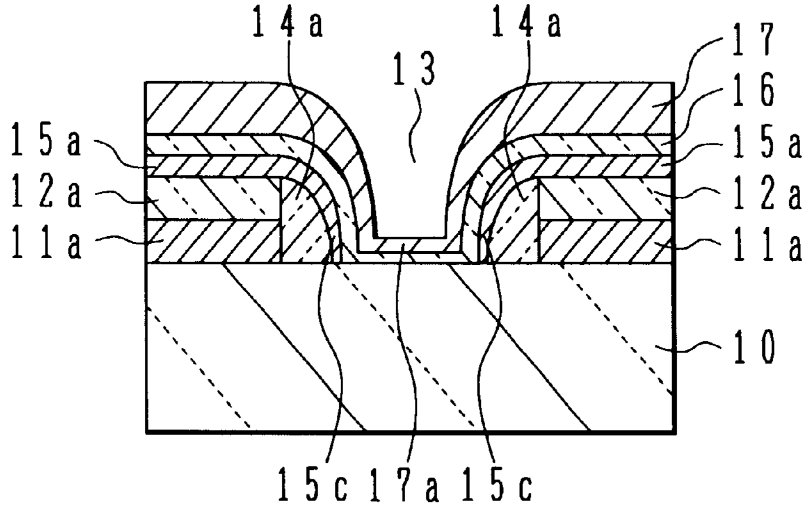

Next, as shown in FIG. 1H, a second gate electrode film 17 made of, for example, $TiN_x$, is deposited on the surface of the second sacrificial film 16 to a thickness of 0.2 μm through reactive sputtering. This reactive sputtering is performed by using a DC sputtering system and Ti as a target while gas of $N_2$+Ar is introduced. The second gate electrode film 17 itself is hereinafter called a "second gate electrode 17" because it is used as the gate electrode without any additional process. A portion of the second gate electrode 17 formed in the recess 13 is hereinafter called a "gate portion 17*a*".

Figure 1I:
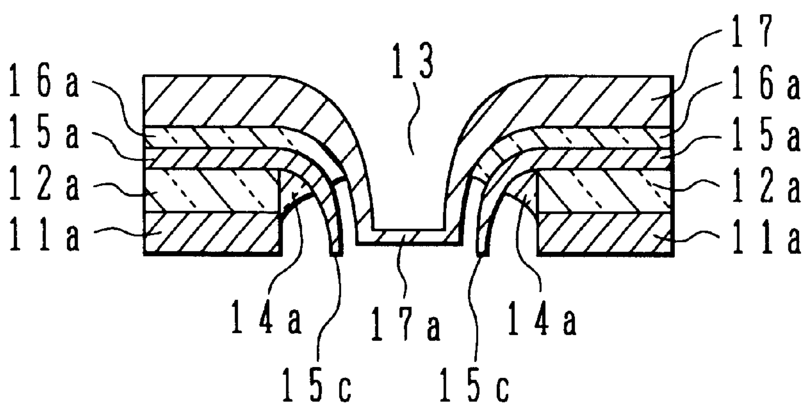

Lastly, as shown in FIG. 1I, all of the substrate 10 and side spacer 14*a* and a portion of the second sacrificial film 16 are etched and removed to expose the first gate electrode (converging electrode) 11*a*, second gate electrode 17 (gate portion 17*b*) and emitter electrode 15*a* (emitter portion 15*c*). A two-electrode element is thus completed. For etching Si of the Si substrate 10 and the like, HF+$HNO_3$+$CH_3COOH$ is used, and for etching silicon oxide and the like, HF+$NH_4F$ is used.

According to the first embodiment described above, the element can be formed having the vertical position of the top of the emitter electrode 15*a* (emitter portion 15*c*) higher (downward as viewed in FIG. 1I) than the vertical position of the top of the second gate electrode 17 (gate portion 17*a*). Electrons emitted from the emitter electrode 15*a* of this field emission element are attracted less by the second gate electrode 17.

According to this embodiment, the vertical position of the emitter electrode 15*a* (emitter portion 15*c*) is definitely determined by the surface of the substrate 10. The relation between the top positions of the emitter electrode 15*a* (emitter portion 15*c*) and second gate electrode 17 (gate portion 17*a*) is determined by the thickness of the second sacrificial film 16 formed at the process shown in FIG. 1G. The top position of the emitter electrode 15*a* (emitter portion 15*c*) always protrudes above the top position of the second gate electrode 17 (gate portion 17*a*). The position precision of these is maintained with good manufacture reproductivity.

Figure 2A:
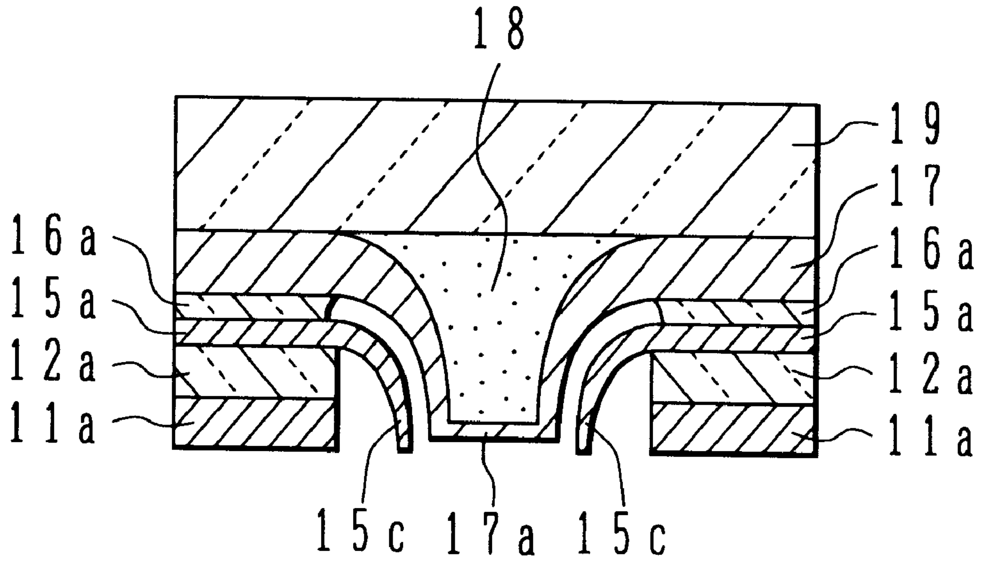
FIGS. 2A and 2B are cross sectional views of a substrate illustrating the methods of reinforcing the field emission element of the first embodiment by using a support substrate, according to modifications of the first embodiment.
Figure 2B:
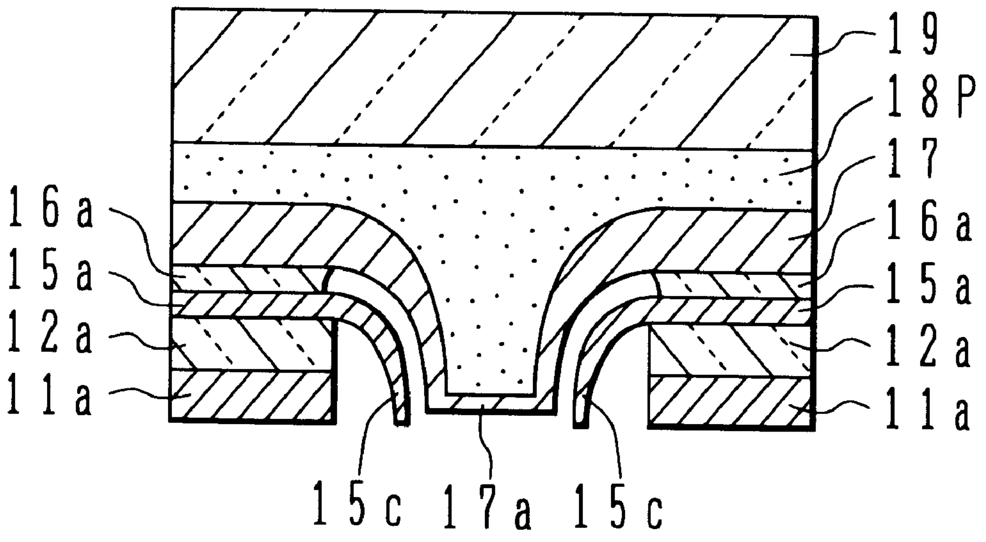

FIGS. 2A and 2B illustrate methods of reinforcing the second gate electrode 17 by using a support substrate, according to modifications of the first embodiment.

In the method shown in FIG. 2A, a silicon nitride film is used as the first insulating film 12*a*. A recess formed in the second gate electrode 17 of the element manufactured by performing the processes shown in FIGS. 1A to 1H of the first embodiment, is filled with a planarizing film 18 of, for example, SOG. Thereafter, the planarizing film 18 is etched back by chemical mechanical polishing (CMP) to planarize the surface thereof. Then, a support substrate 19 is adhered to the second gate electrode 17 and planarizing film 18 through electrostatic bonding or by adhesive.

Next, a process similar to the etching process shown in FIG. 1I is performed to remove unnecessary portions such as the substrate 10.

As shown in FIG. 2A, therefore, the first gate electrode 11*a*, second gate electrode 17 (gate portion 17*a*) and emitter electrode 15*a* (emitter portion 15*c*) are exposed and the two-electrode element is completed.

Also in another modification shown in FIG. 2B, a silicon nitride film is used as the first insulating film 12*a*. On the surface of the second gate electrode 17 of the element manufactured by performing the processes shown in FIGS. 1A to 1H of the first embodiment, adhesive 18*p* such as epoxy resin and low melting point glass is coated to bond a supporting substrate 19 with the element.

Then, a process similar to the etching process shown in FIG. 1I is performed to remove unnecessary portions such as the substrate 10.

As shown in FIG. 2B, therefore, the first gate electrode 11*a*, second gate electrode 17 (gate portion 17*a*) and emitter electrode 15*a* (emitter portion 15*c*) are exposed and the two-electrode element is completed.

Next, with reference to FIGS. 3A to 3F, a method of manufacturing a field emission element (two-electrode element) according to the second embodiment of the invention will be described. Also in the second embodiment, the two-electrode element has first and second gate electrodes. In FIGS. 3A to 3F, identical reference numerals to those of the first embodiment represent fundamentally similar elements.

In the second embodiment, the shape of the tip of the emitter electrode (emitter portion) is sharpened. The top of the emitter electrode (emitter portion) can be protruded higher than the tops of the first and second gate electrodes. In the manufacture method of the second embodiment, first, the processes shown in FIGS. 1A to 1C of the first embodiment are performed.

In the first embodiment, the etch-back process for the first sacrificial film 14 after the process shown in FIG. 1C, is stopped when the surface of the substrate 10 is exposed.

Figure 3A:
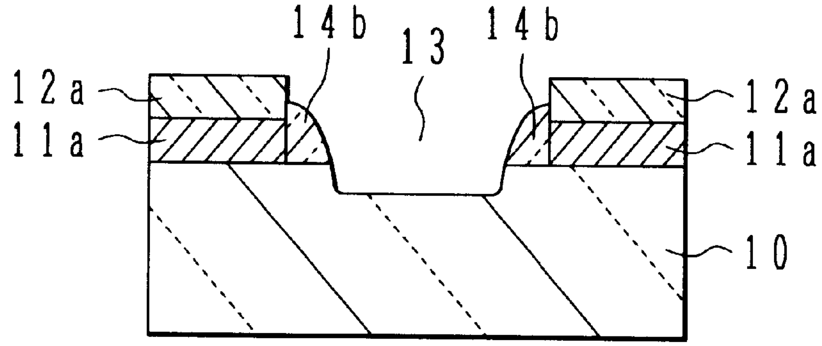
FIGS. 3A to 3F are cross sectional views of a substrate illustrating the manufacture steps of a field emission element (three-electrode element) according to a second embodiment of the invention.

As shown in FIG. 3A, in the second embodiment, etching continues until the substrate 10 is etched to some depth, to form a side spacer 14*b*. In this case, the circular 13 formed in the substrate 10 has a rounded bottom corner as shown.

The specification of Japanese Patent application No. HEI 9-292835 (JP-A-10-188786) submitted by the same assignee of the present application describes a method of rounding a bottom corner 13*a* of a recess 13 formed in a substrate 10, by controlling a ratio of anisotropic etching components to isotropic etching components during drying etching.

Figure 20:
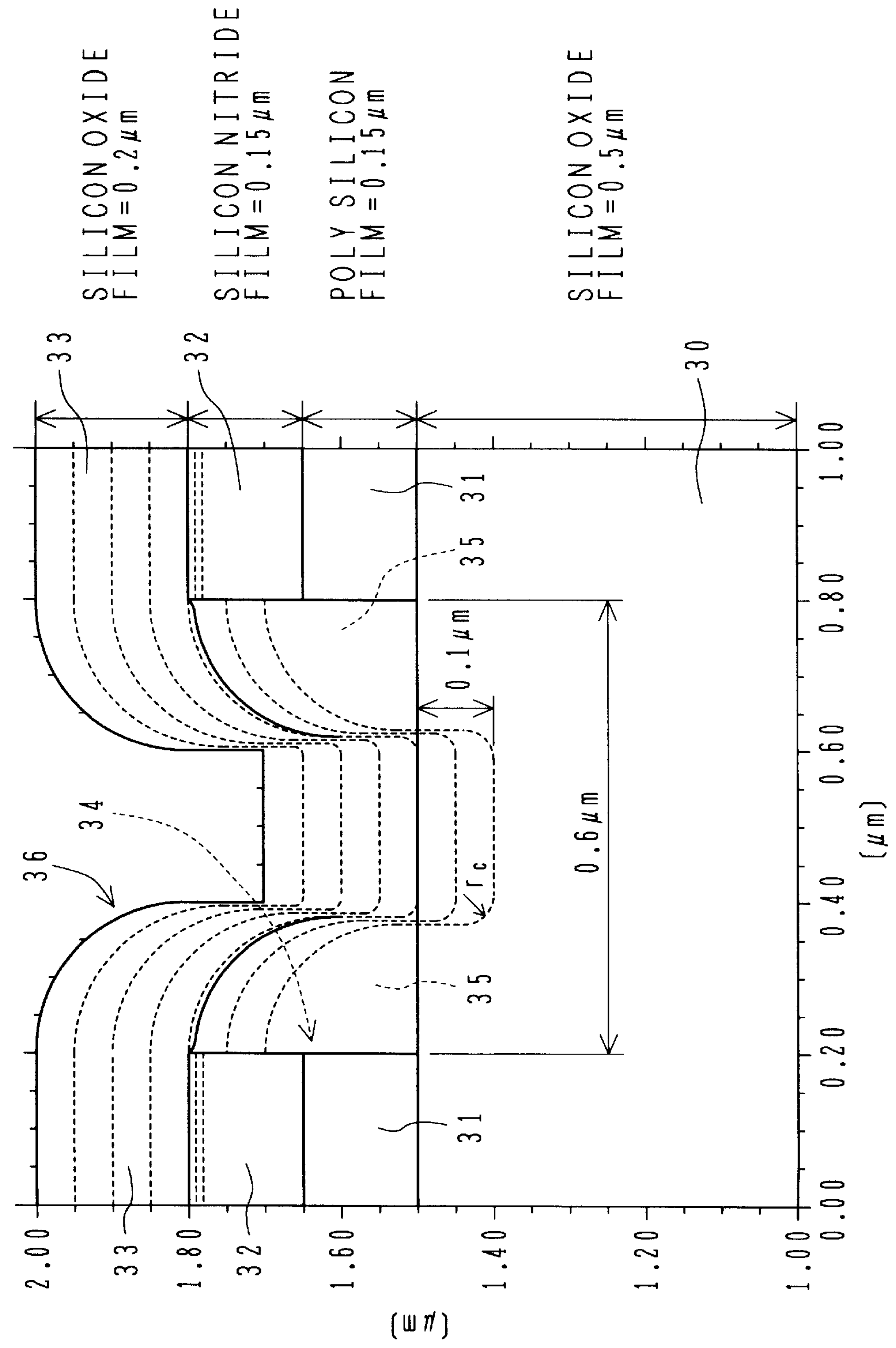
FIG. 20 is a graph showing simulation results of an etching process according to an embodiment of the invention.
Figure 21:
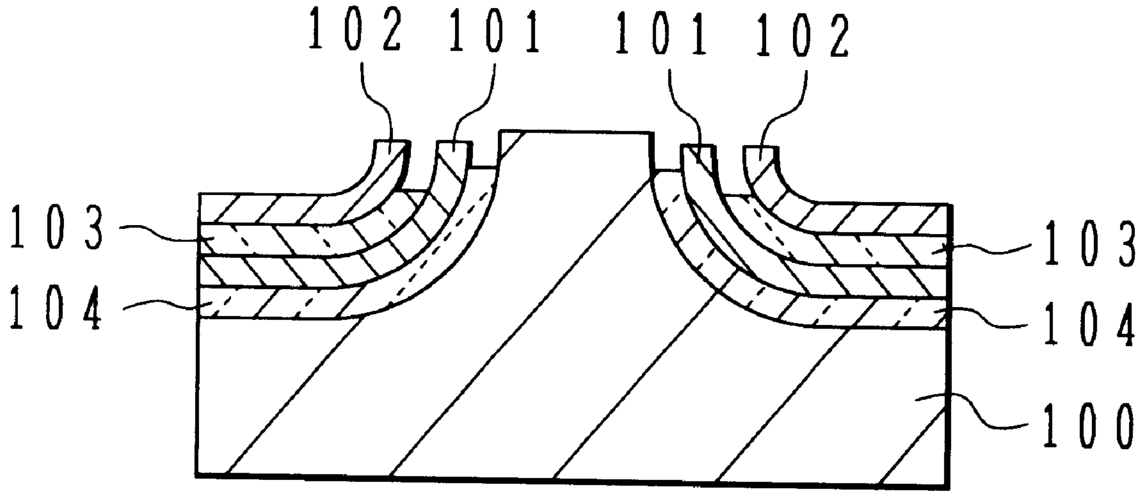
FIG.21 PRIOR ART
FIG. 21 is a cross sectional view of a field emission element manufactured by conventional techniques.

FIG. 20 is a simulation graph of etching. On a silicon oxide substrate 30 of 0.5 μm thickness, a polysilicon film 31 of 0.15 μm thickness and a silicon nitride film 32 of 0.15 μm thickness are formed in this order, through which a recess 34 is formed. A silicon oxide film 33 of 0.2 μm is deposited on a whole surface of the substrate. This graph simulates the etch-back of such a substrate structure. In FIG. 20, the surface of the silicon oxide film 33 indicated by a solid line shows the surface of the substrate structure before the etch-back. As the etching time lapses, the surface changes as shown by dotted lines.

This simulation graph shown in FIG. 20 was obtained when dry etching was performed at an anisotropy factor Af=0.8 (i.e., (isotropic etching rate): (anisotropic etching rate)=1:5) until a side spacer 35 was formed on the side wall of the recess 34 and the substrate 30 was etched 0.1 μm deep from the substrate surface. The anisotropy factor Af is defined by:

$$Af=1-R_i/R_{i+d}$$

where $R_i$ is a horizontal etching rate of the recess, and $R_{i+d}$ is a vertical etching rate of the recess. Af=1 for perfect anisotropy, whereas Af=0 for perfect isotropy.

The radius rc of curvature of the bottom corner of the recess was about 0.03 μm. As shown by the simulation curves, the bottom corner of the recess 36 is rounded immediately after the etching.

At an anisotropy factor smaller than Af=0.8, it was possible to have a radius rc of curvature of the bottom corner of the recess 36 larger than 0.03 μm before the bottom of the recess 36 reached the substrate surface.

For example, the etching process shown in FIG. 3A is performed by using a magnetron RIE system and etching gas of $CHF_3$+$CO_2$+Ar at a reaction chamber pressure of 50 mTorr.

Figure 3B:
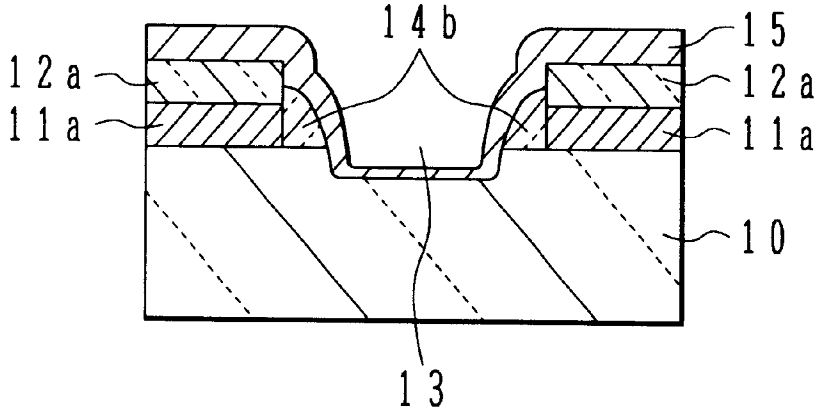

Next, as shown in FIG. 3B, an emitter electrode film 15 made of, for example, $TiN_x$, is deposited to a thickness of 0.1 μm (as measured relative to the upper flat surface) through reactive sputtering, on the surfaces of the substrate 10 exposed at the bottom of the recess 13, of the side spacer 14*b* and of the first insulating film 12*a*. This reactive sputtering is performed by using a DC sputtering system and Ti as a target while gas of $N_2$+Ar is introduced. The emitter electrode film 15 is therefore formed on the surfaces of the substrate 10 and side spacer 14*ba*, inheriting the surface topology of these, with a step being formed on the surface of the emitter electrode film 15.

Figure 3C:
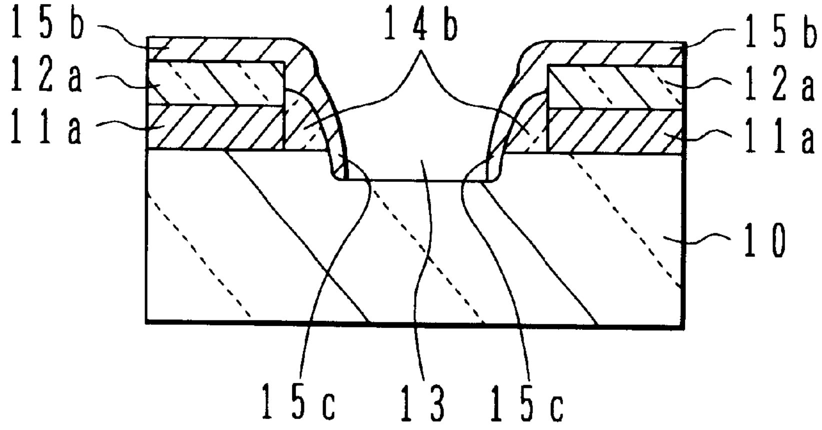

Next, as shown in FIG. 3C, the whole area of the emitter electrode film 15 is etched back by about 0.05 μm to completely remove it on the bottom of the recess 13 and leave it on the first insulating film 12*a* and side wall of the recess 13 as an emitter electrode 15*b*. For this etch-back, anisotropical dry etching is performed. For example, it is performed by using a magnetron RIE system at a reaction chamber pressure of 125 mTorr by using $C_{12}$ as etching gas. Since the bottom corner of the recess corresponding to that of the recess 36 shown in FIG. 20 is rounded, the top of the emitter electrode 15*b* (emitter portion 15*c*) has a sharp edge.

Figure 3D:
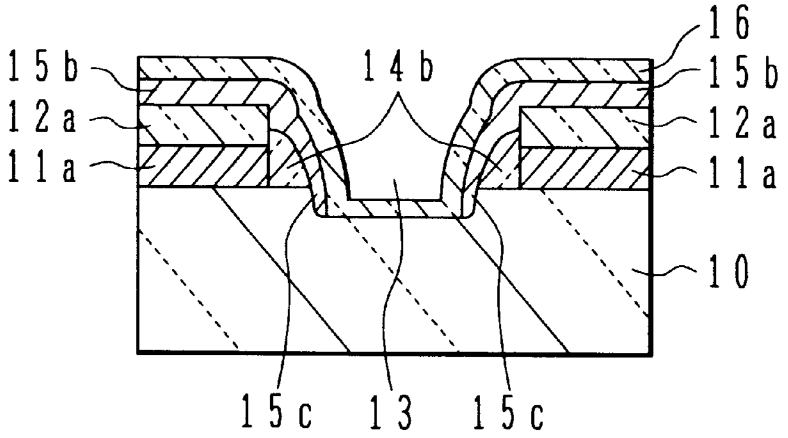

Next, as shown in FIG. 3D, a second sacrificial film (insulating film) 16 made of Si oxide film is deposited on a whole surface of the substrate to a thickness of 0.1 μm by atmospheric pressure CVD. For example, this film is formed under the conditions of source gas of $O_3$ and TEOS and a substrate temperature of 400° C. The second sacrificial film 16 is deposited on the surfaces of the substrate 10 exposed at the bottom of the recess 13 and of the emitter electrode 15*b*, inheriting (conformal to) the surface topology thereof.

Figure 3E:
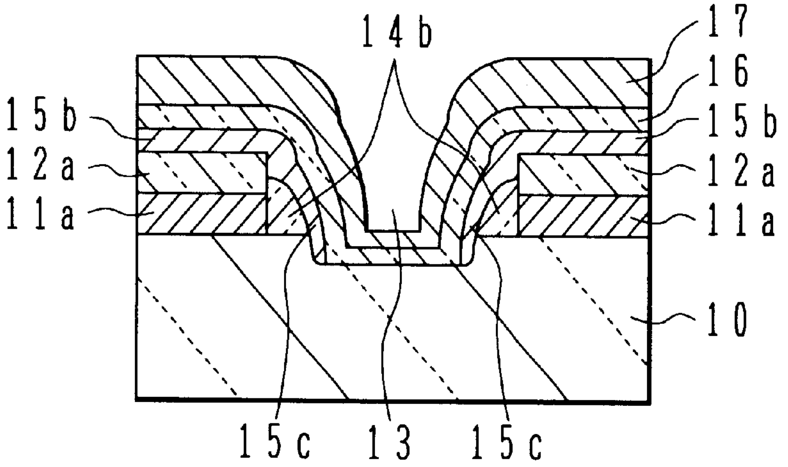

Next, as shown in FIG. 3E, a second gate electrode film 17 made of, for example, $TiN_x$, is deposited on the surface of the second sacrificial film 16 to a thickness of 0.2 μm through reactive sputtering. This reactive sputtering is performed by using a DC sputtering system and Ti as a target while gas of $N_2$+Ar is introduced.

Figure 3F:
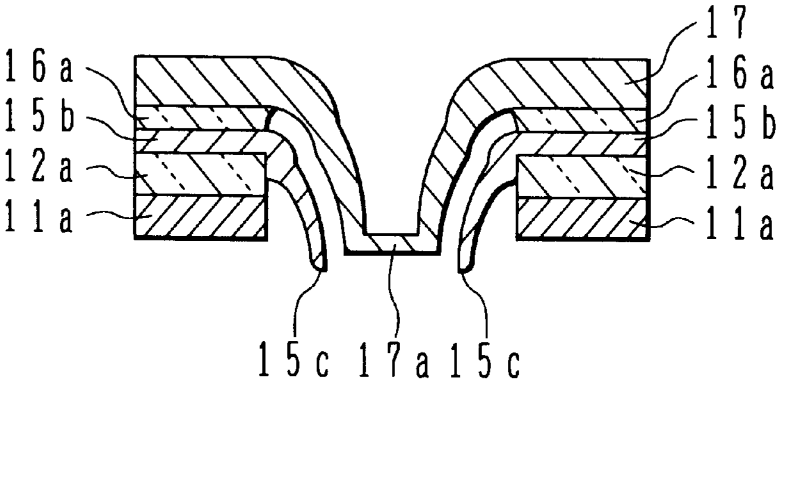

Lastly, as shown in FIG. 3F, all of the substrate 10 and side spacer 14*b* and a portion of the second sacrificial film 16 are etched and removed to expose the first gate electrode (converging electrode) 11*a*, second gate electrode 17 (gate portion 17*a*) and emitter electrode 15*b* (emitter portion 15*c*). A two-electrode element is thus completed. For etching Si of the Si substrate 10 and the like, HF+$HNO_3$+$CH_3COOH$ is used, and for etching silicon oxide and the like, HF+$NH_4F$ is used.

According to the second embodiment, as seen from FIG. 3F, the inner top of the emitter electrode 15*b* (emitter portion 15*c*) has a very sharp edge, because of the etch-back process shown in FIG. 3C. The vertical position of the top of the emitter electrode 15*b* (emitter portion 15*c*) is higher than the vertical positions of the top of the first gate electrode 11*a* and the flat-topped surface of the second gate electrode 17 (gate portion 17*a*).

Next, with reference to FIGS. 4A to 4C, a method of manufacturing a field emission element (two-electrode element) according to the third embodiment of the invention will be described. Also in the third embodiment, the two-electrode element has first and second gate electrodes.

In the third embodiment, the second sacrificial film 16 is formed by the process providing a step coverage relatively inferior to that of the first and second embodiments, in order to reduce the electric capacitance between the emitter electrode and second gate electrode and improve the dielectric breakdown voltage. In the manufacture steps of the third embodiment, first, processes similar to those shown in FIGS. 1A to 1C of the first embodiment are performed, and then processes similar to those shown in FIGS. 3A to 3C are performed.

In the third embodiment, after the process shown in FIG. 3C, the second sacrificial film of silicon nitride is deposited through reactive sputtering.

Figure 4A:
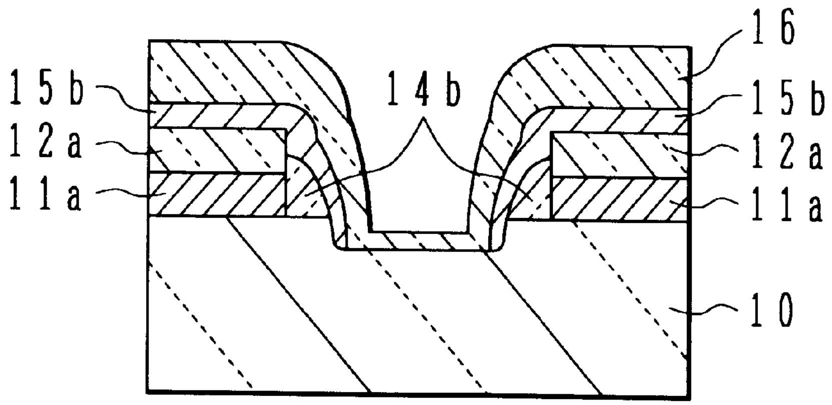
FIGS. 4A to 4C are cross sectional views of a substrate illustrating the manufacture steps of a field emission element according to a third embodiment of the invention.

As shown in FIG. 4A, the second sacrificial film 16 is deposited on a whole surface of the substrate to a thickness of 0.2 μm (as measured relative to the surface of the first insulating film 12*a*). For example, as the reactive sputtering conditions of forming the silicon nitride film, an Si target is used while gas of $N_2$+Ar is introduced.

The step coverage of the second sacrificial film 16 formed through reactive sputtering is inferior to that of a silicon oxide film formed through thermal CVD such as atmospheric pressure CVD using source gas of $O_3$ ($O_2$) and TEOS and low pressure CVD using source gas of $SiH_4$ and $O_3$ ($O_2$), or photo assisted CVD.

The second sacrificial film 16 having a poor step coverage may be formed through evaporation, plasma CVD or the like, instead of sputtering.

The second sacrificial film 16 may have a stacked layer structure. If a film having a poor step coverage and a low dielectric breakdown voltage is used in combination with a film having a good step coverage and a high dielectric breakdown voltage, a film having a poor step coverage and a high dielectric breakdown voltage can be formed.

Assuming that the second sacrificial film 16 has the same thickness at the bottom of the recess as that of the first and second embodiments, the thickness at the other area is greater than the first and second embodiments.

Figure 4B:
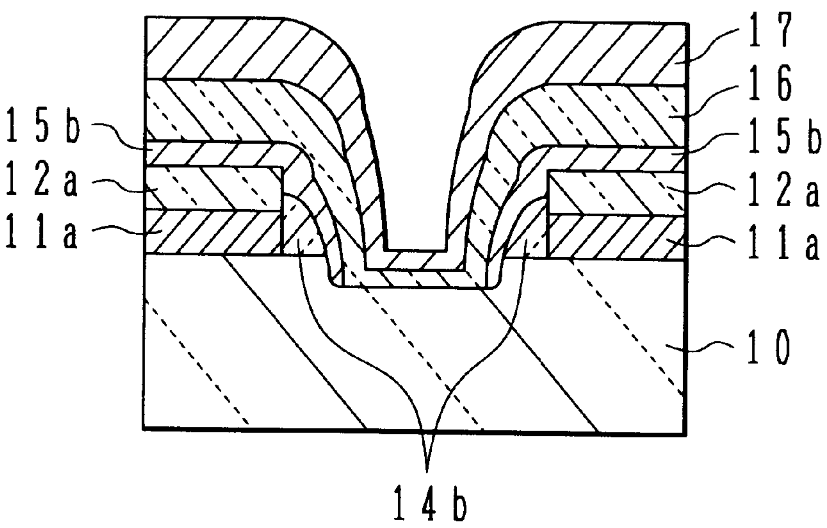

Next, as shown in FIG. 4B, a second gate electrode film 17 made of, for example, $TiN_x$, is deposited on the surface of the second sacrificial film 16 to a thickness of 0.2 μm through reactive sputtering. This reactive sputtering is performed by using a DC sputtering system and Ti as a target while gas of $N_2$+Ar is introduced.

Figure 4C:
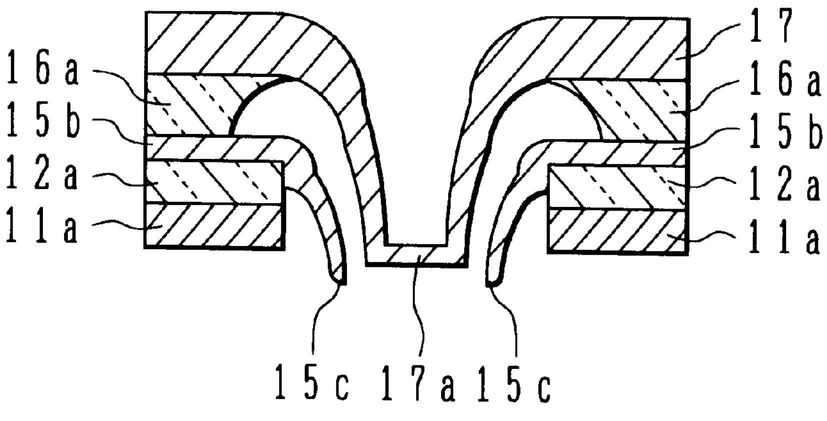

Lastly, as shown in FIG. 4C, all of the substrate 10 and side spacer 14*b* and a portion of the second sacrificial film 16 are etched and removed to expose the first gate electrode (converging electrode) 11*a*, second gate electrode 17 (gate portion 17*a*) and emitter electrode 15*b* (emitter portion 15*c*). A two-electrode element is thus completed. For etching Si of the Si substrate 10 and the like, HF+$HNO_3$+$CH_3COOH$ is used, and for etching silicon oxide and the like, HF+$NH_4F$ is used. For etching a silicon nitride film, $H_3PO_4$ heated to 160 to 180° C. is used.

As compared to the second embodiment shown in FIG. 3F, the field emission element of the third embodiment shown in FIG. 4C has a higher dielectric breakdown voltage because the electric capacitance between the emitter electrode 15*b* (emitter portion 15*c*) and second gate electrode 17 (gate portion 17*a*) can be reduced.

FIGS. 5A to 5F are cross sectional views of a substrate illustrating the manufacture steps of a field emission element according to a modification of the third embodiment. In this modification, the diameter of the recess 13 is made small to sharpen the emitter tip and lower the emitter resistance.

First, a first gate electrode film 11 and a first insulating film 12 are formed on a substrate 10 by a process similar to that described with FIG. 1A. In the first embodiment, the first insulating film 12*a* and first gate electrode 11*a* having the recess 13 of 0.6 μm diameter and 0.3 depth are formed by anisotropically etching the first insulating film 12 and first gate electrode film 11 by using the resist pattern as a mask. In the modification of the third embodiment, the diameter of an opening of a resist pattern is made smaller to form a first insulating film 12*a* and a first gate electrode 11 a having a recess 13 of 0.45 μm diameter and 0.3 μm depth. A portion of the recess 13 corresponding to the first gate electrode 11*a* forms a gate hole.

Figure 5A:
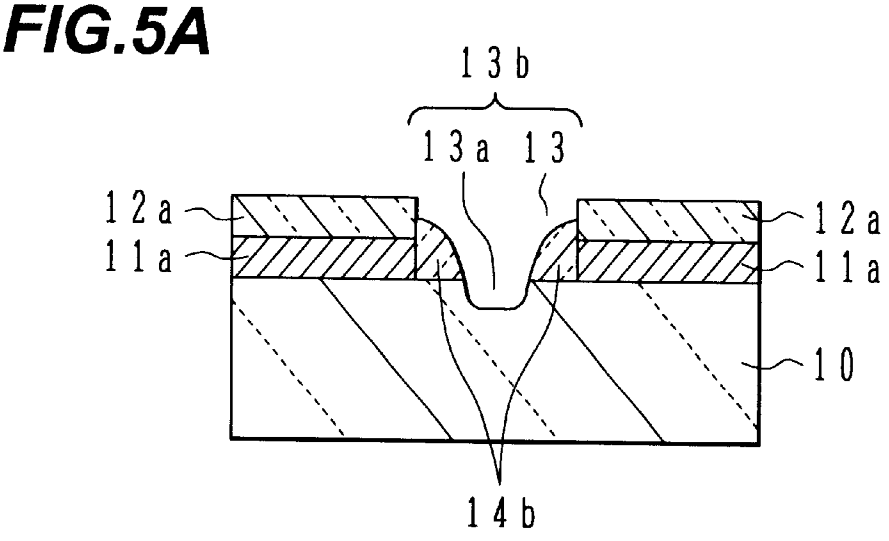
FIGS. 5A to 5F are cross sectional views of a substrate illustrating the manufacture steps of a field emission element according to a modification of the third embodiment.

Next, as shown in FIG. 5A, a side spacer 14*b* is formed on the side walls of the first gate 11*a* and first insulating film 12*a*, and a recess 1 3*a* having a depth of 0.1 μm is formed in the substrate 10. The side spacer 14*b* and recess 13*a* can be formed by a process similar to that shown in FIG. 3A. The bottom corner of the recess 13*a* is rounded. The diameter of the bottom of the recess 13*a* is 0.15 μm, whereas that of the recess 13 shown in FIG. 1B is 0.3 μm. An aspect ratio of a recess 13*b* constituted of the recess 13*a* and recess 13 shown in FIG. 5A is larger than that of the first and second embodiments. An aspect ratio is defined as (recess depth)/(recess diameter).

For example, the etching process of forming the side spacer 14*b* and recess 13*a* is performed by using a magnetron RIE system under the conditions of a reaction chamber pressure of 50 mTorr and etching gas of $CHF_3$+$CO_2$+Ar.

Figure 5B:
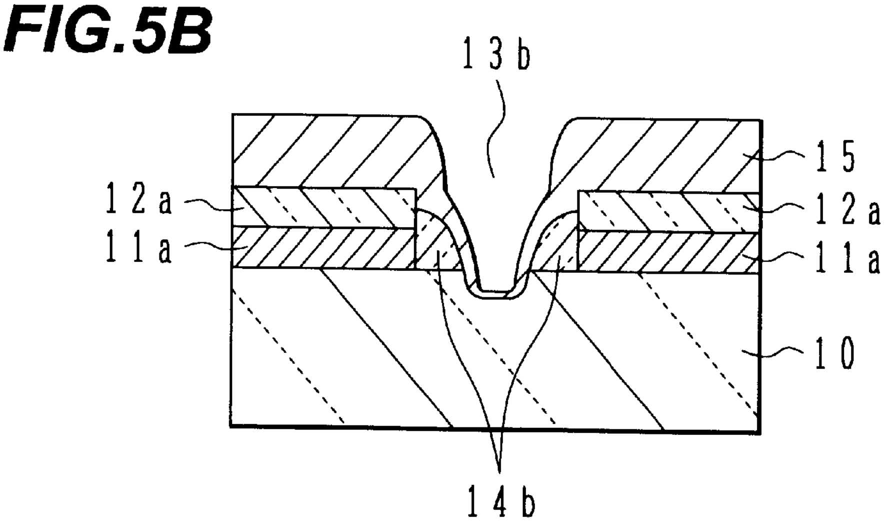

Next, as shown in FIG. 5B, an emitter electrode film 15 made of, for example, $TiN_x$, is deposited to a thickness of 0.3 μm through reactive sputtering over a whole surface of the substrate. Since the aspect ratio of the recess 13*b* is large, the emitter electrode film 15 is deposited on the flat surface of the first insulating film 12*a* to a thickness of 0.3 μm, whereas it is deposited thinner on the bottom of the recess 13*b*.

This reactive sputtering is performed by using a DC sputtering system and Ti as a target while gas of $N_2$+Ar is introduced.

Next, the whole surface of the emitter electrode film 15 is etched back by about 0.05 μm to completely remove it on the bottom of the recess 13*b*.

Figure 5C:
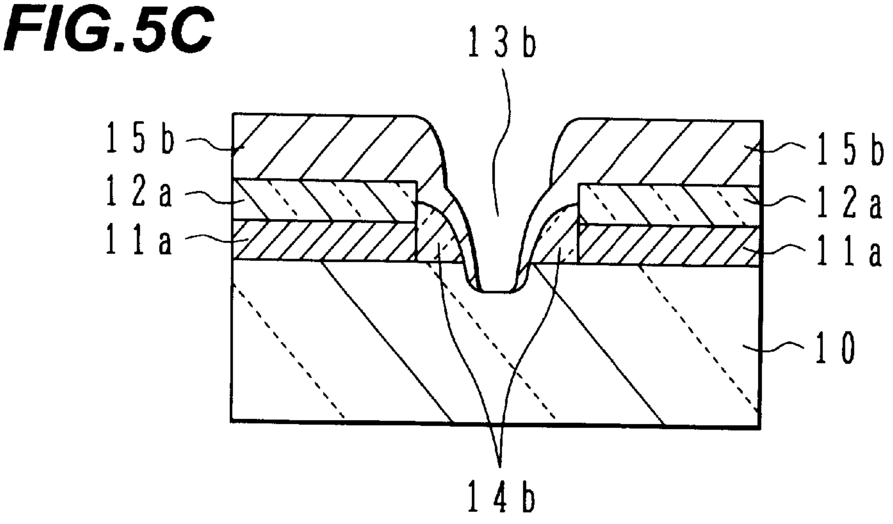

As shown in FIG. 5C, the emitter electrode film 15 on the first insulating film 12*a* and side wall of the recess 13*b* are partially left as an emitter electrode 15*b*.

For this etch-back, anisotropical dry etching is performed by using a magnetron RIE system, for example. In this case, $Cl_2$ is used as etching gas and a reaction chamber pressure is set to 125 mTorr.

Figure 5D:
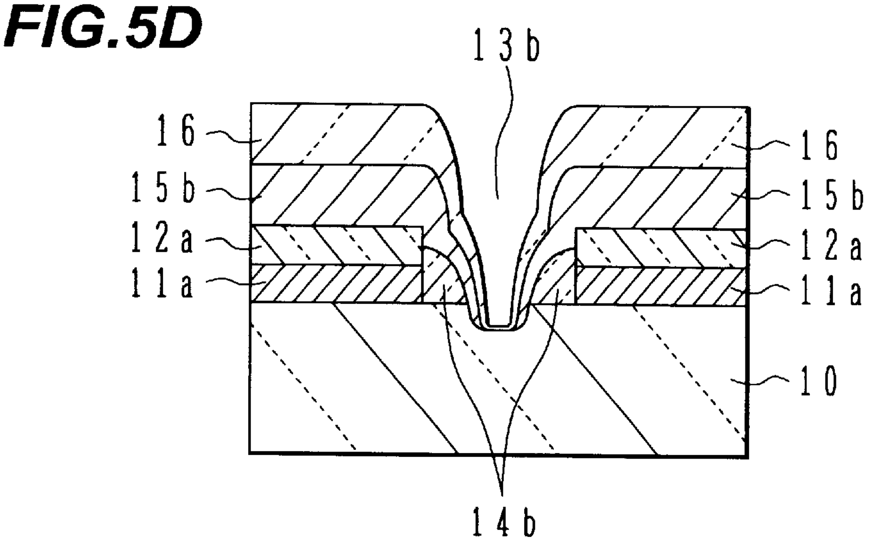

Next, as shown in FIG. 5D, a second sacrificial film 16 made of Si oxide is deposited on a whole surface of the substrate to a thickness of 0.3 μm by reactive sputtering. Since the aspect ratio of the recess 13*b* is large, the second insulating film 16 is deposited on the flat surface of the first insulating film 12*a* to a thickness of 0.3 μm, whereas it is deposited thinner on the bottom of the recess 13*b*.

This reactive sputtering is performed by using a DC sputtering system and Si doped with impurities such as B or P while gas of $O_2$+Ar is introduced.

Figure 5E:
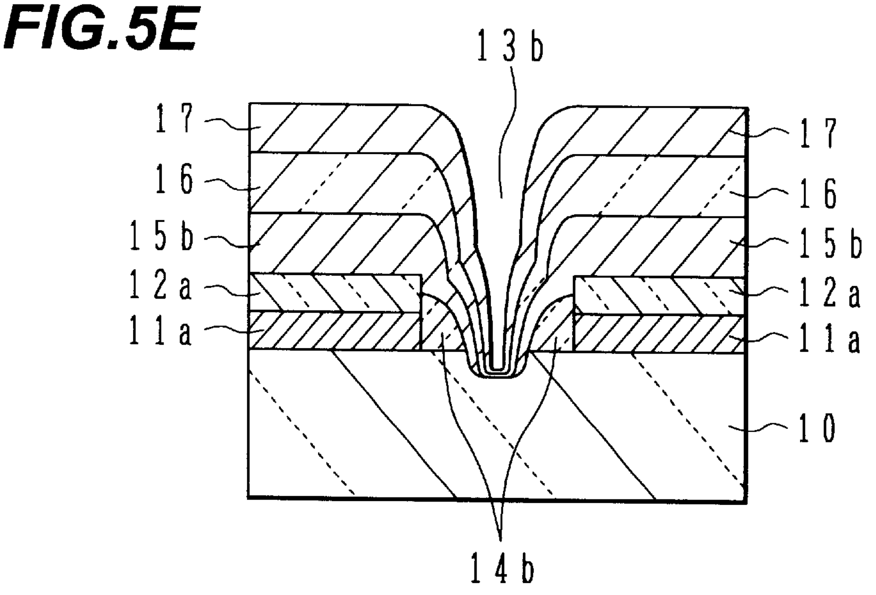

Next, as shown in FIG. 5E, a second gate electrode film 17 made of $TiN_x$ is deposited to a thickness of 0.2 μm through reactive sputtering over a whole surface of the substrate. This reactive sputtering is performed by using a DC sputtering system and Ti as a target while gas of $N_2$+Ar is introduced.

Lastly, all of the substrate 10 and side spacer 14*b* and a portion of the second sacrificial film 16 are etched and removed.

Figure 5F:
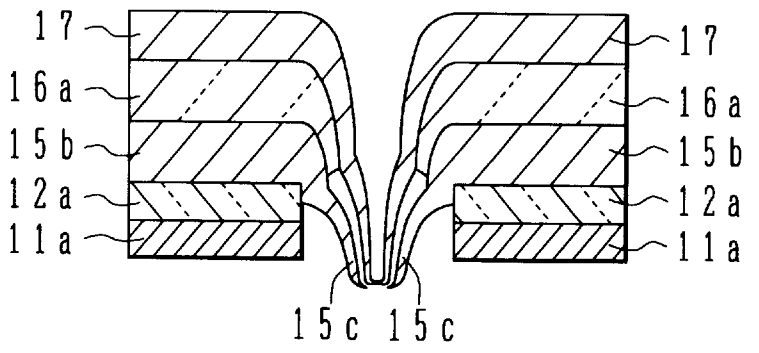

As shown in FIG. 5F, a two-electrode element is therefore formed. For etching the Si substrate, HF+$HNO_3$+$CH_3COOH$ is used, and for etching the silicon oxide film, HF+$NH_4F$ is used.

The emitter electrode 15*b* is applied with a negative potential. As a positive potential is applied to the second gate electrode 17, electrons can be emitted from the emitter electrode 15*b* (emitter portion 15*c*). By applying a negative potential to the first gate electrode (converging electrode) 11*a*, electrons emitted from the emitter electrode 15*b* (emitter portion 15*c*) can be converged.

According to this embodiment, since the aspect ratio of the recess 13*b* is set large, it is possible to sharpen the tip of the emitter electrode (emitter portion 15*c*) and lower the emitter resistance. In other words, the emitter electrode 15*b* on the flat portion becomes thicker because of a large aspect ratio of the recess 13*b*, and so the emitter resistance can be lowered. The reason for this will be later detailed with reference to FIGS. 7A and 7B and FIGS. 8A and 8B.

FIGS. 6A to 6F are cross sectional views of a substrate illustrating the manufacture steps of a field emission element according to another modification of the third embodiment. In this modification, the first insulating film 12 and first gate electrode film 11 are made thicker to thereby obtain a large aspect ratio of the recess 13*b*, sharpen the emitter tip and lower the emitter resistance.

In the first embodiment, the thickness of the first gate electrode film 11 and the thickness of the first insulating film 12 are both set to 0.15 μm. In this modification of the third embodiment, the first gate electrode film 11 and first insulating film 12 are both set thicker to 0.3 μm. Thereafter, similar to the process shown in FIG. 1B, the first gate 11*a* and first insulating film 12*a* having a recess 13 are formed. This recess 13 has a diameter of 0.6 μm and a depth of 0.6 μm.

Figure 6A:
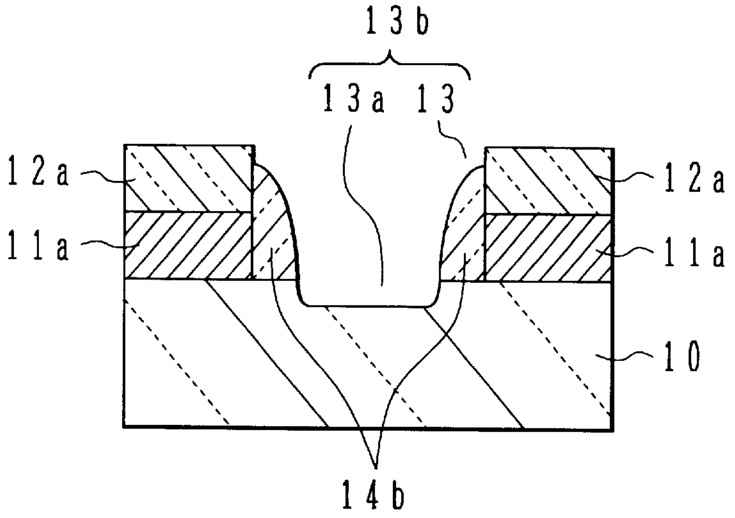
FIGS. 6A to 6F are cross sectional views of a substrate illustrating the manufacture steps of a field emission element according to another modification of the third embodiment.

Next, as shown in FIG. 6A, a side spacer 14*b* is formed on the side walls of the first gate 11*a* and first insulating film 12*a*, and a recess 13*a* having a depth of 0.1 μm is formed in the substrate 10. The bottom corner of the recess 13*a* is rounded. The depth of a recess 13*b* constituted of the recess 13*a* and recess 13 is 0.7 μm, whereas the depth of the recess 13 shown in FIG. 3A is 0.4 μm. Therefore, an aspect ratio of the recess 13*b* shown in FIG. 6A is larger.

For example, the etching process of forming the side spacer 14*b* and recess 13*a* is performed by using a magnetron RIE system under the conditions of a reaction chamber pressure of 50 mTorr and etching gas of $CHF_3$+$CO_2$+Ar.

Figure 6B:
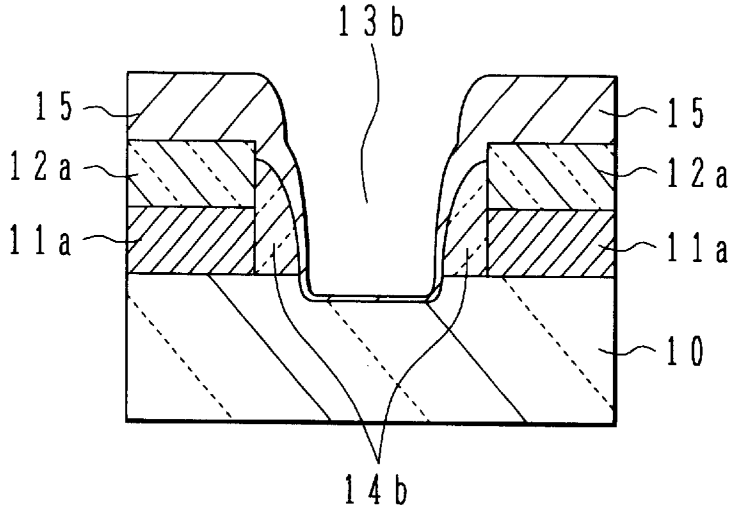

Next, as shown in FIG. 6B, an emitter electrode film 15 made of $TiN_x$ is deposited to a thickness of 0.3 μm through reactive sputtering over a whole surface of the substrate surface. Since the aspect ratio of the recess 13*b* is large, the emitter electrode film 15 is deposited on the flat surface of the first insulating film 12*a* to a thickness of 0.3 μm, whereas it is deposited thinner on the bottom of the recess 13*b*.

This reactive sputtering is performed by using a DC sputtering system and Ti as a target while gas of $N_2$+Ar is introduced.

Next, the whole surface of the emitter electrode film 15 is etched back by about 0.05 μm to completely remove it on the bottom of the recess 13*b*.

Figure 6C:
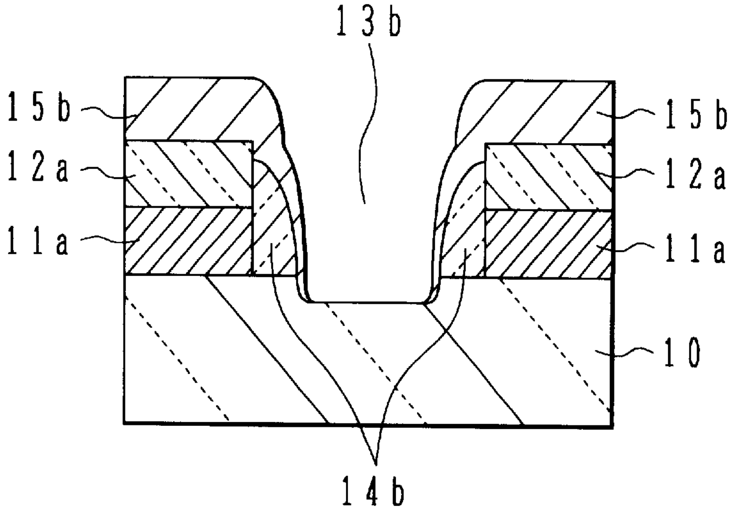

As shown in FIG. 6C, the emitter electrode film 15*b* on the first insulating film 12*a* and side wall of the recess 13*b* are partially left as an emitter electrode 15*b*.

For this etch-back, anisotropical dry etching is performed by using a magnetron RIE system, for example. In this case, $C1_2$ is used as etching gas and a reaction chamber pressure is set to 125 mTorr.

Figure 6D:
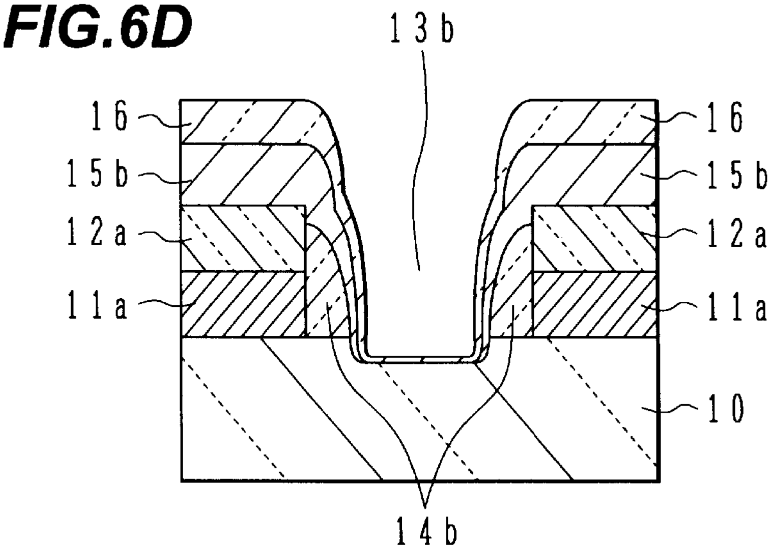

Next, as shown in FIG. 6D, a second insulating film 16 made of silicon nitride is deposited on a whole surface of the substrate to a thickness of 0.3 μm by reactive sputtering. Since the aspect ratio of the recess 13*b* is large, the second insulating film 16 is deposited on the flat surface of the first insulating film 12*a* to a thickness of 0.3 μm, whereas it is deposited thinner on the bottom of the recess 13*b*.

This reactive sputtering is performed by using a DC sputtering system and Si doped with impurities such as B or P while gas of $N_2$+Ar is introduced.

Figure 6E:
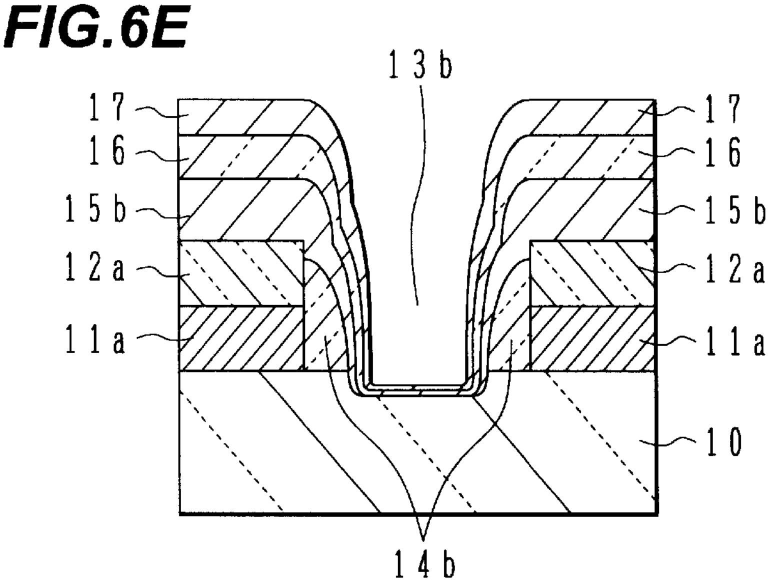

Next, as shown in FIG. 6E, a second gate electrode film 17 made of $TiN_x$ is deposited to a thickness of 0.2 μm through reactive sputtering over a whole surface of the substrate. This reactive sputtering is performed by using a DC sputtering system and Ti as a target while gas of $N_2$+Ar is introduced.

Lastly, all of the substrate 10 and side spacer 14*b* and a portion of the second sacrificial film 16 are etched and removed.

Figure 6F:
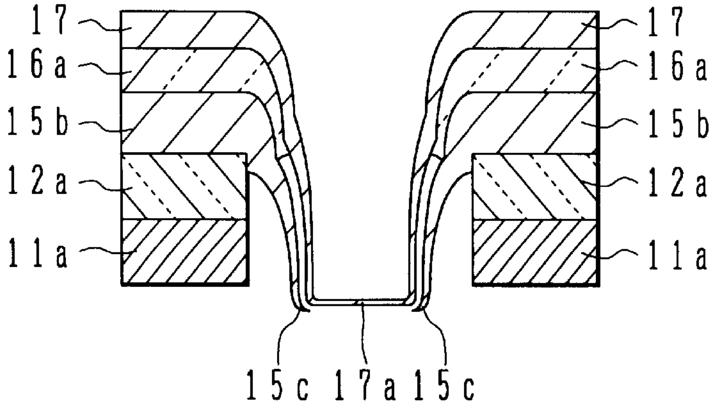

As shown in FIG. 6F, a two-electrode element is therefore formed. For etching the Si substrate, HF+$HNO_3$+ $CH_3COOH$ is used, and for etching the silicon nitride film, $H_3PO_4$ heated to a temperature from 160 to 180° C. is used. For etching the silicon oxide film, HF+$NH_4F$ is used.

According to this modification, the first gate electrode film 11 and first insulating film 12 are made thick to so that the aspect ratio of the recess can be made large, the tip of the emitter electrode 15*b* (emitter portion 15*c*) can be sharpened and the emitter resistance can be lowered. This reason will be described below.

Figure 7A:
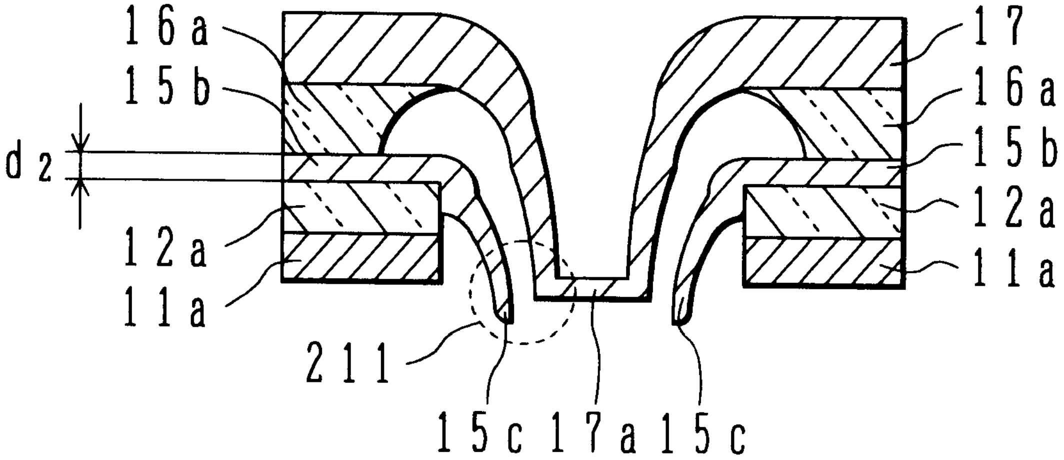
FIG. 7A is a cross sectional view of the substrate of the field emission element shown in FIG. 4C.
Figure 7B:
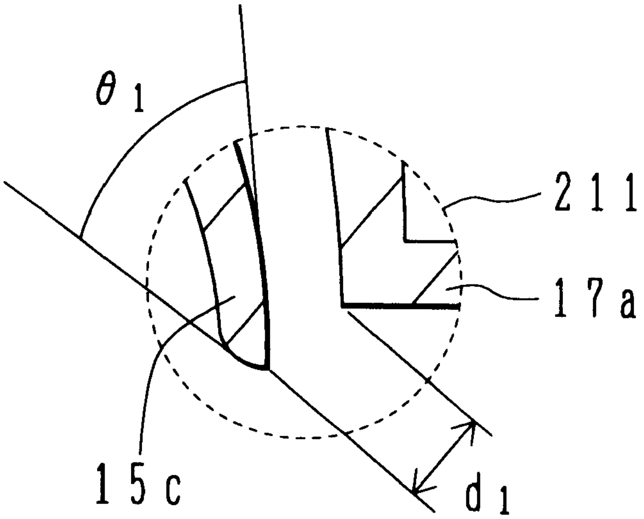
FIG. 7B is an enlarged view showing the tip of the emitter electrode.

FIG. 7A is a cross sectional view of the substrate of the field emission element of the third embodiment shown in FIG. 4C, and FIG. 7B is an enlarged view showing the tip 211 of the emitter electrode 15*b* (emitter portion 15*c*) shown in FIG. 7A.

Figure 8A:
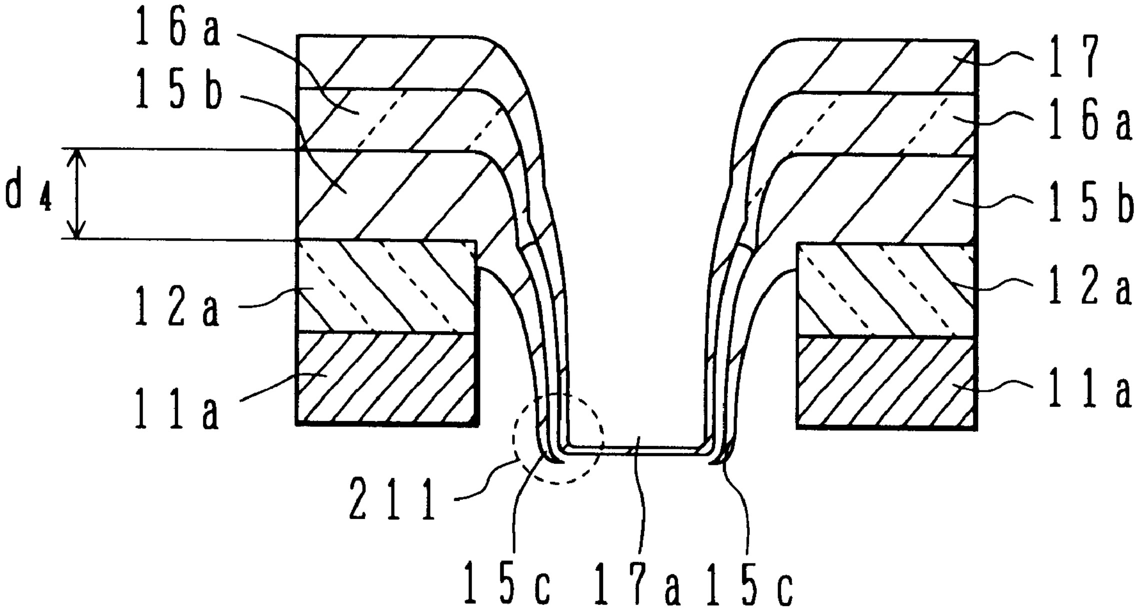
FIG. 8A is a cross sectional view of the substrate of the field emission element shown in FIG. 6F.
Figure 8B:
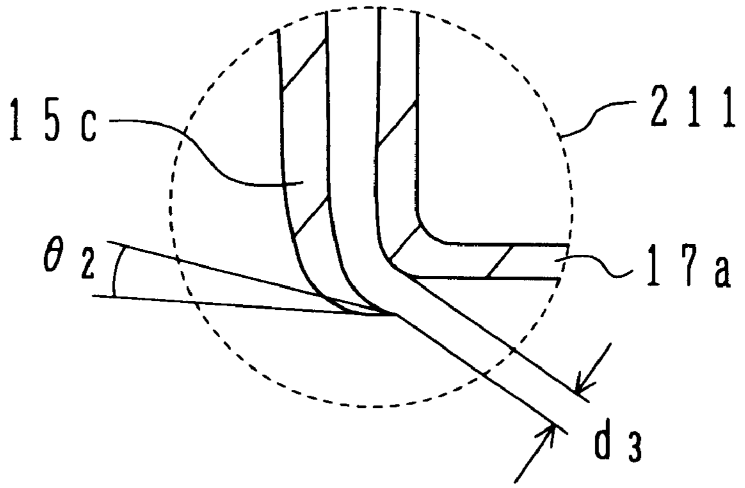
FIG. 8B is an enlarged view showing the tip of the emitter electrode.

FIG. 8A is a cross sectional view of the substrate of the field emission element shown in FIG. 6F, and FIG. 8B is an enlarged view showing the tip 211 of the emitter electrode 15*b* (emitter portion 15*c*) shown in FIG. 8A.

The thickness d4 of the emitter electrode 15*b* on the flat surface shown in FIG. 8A is greater than the thickness d2 of the emitter electrode 15*b* on the flat surface shown in FIG. 7A. The wiring resistance of the emitter of the field emission element shown in FIG. 8A can therefore be lowered.

The apex angle θ2 at the tip of the emitter electrode 15*b* (emitter portion 15*c*) shown in FIG. 8B is smaller than the apex angle θ1 at the tip of the emitter electrode 15*b* (emitter portion 15*c*) shown in FIG. 7B. The shortest distance d3 between the top edge of the emitter electrode 15*b* (emitter portion 15*c*) and the second gate 17 (gate portion 17*a*) shown in FIG. 8B is shorter than the shortest distance d1 between the top edge of the emitter electrode 15*b* (emitter portion 15*c*) and the second gate 17 (gate portion 17*a*) shown in FIG. 7B. As a result of these, the intensity of the electric field near the tip of the emitter electrode 15*b* (emitter portion 15*c*) shown in FIGS. 8A and 8B increases. Even if the voltage applied to the emitter electrode 15*b* or second gate electrode 17 is lowered, electrons can be emitted from the tip of the emitter electrode 15*b* (emitter portion 15*c*).

The reason why the apex angle θ2 at the tip of the emitter electrode 15*b* (emitter portion 15*c*) shown in FIGS. 8A and 8B is smaller than the apex angle θ1 at the tip of the emitter electrode 15*b* (emitter portion 15*c*) shown in FIGS. 7A and 7B will be described. Since the emitter electrode 15*b* (emitter portion 15*c*) near the tip thereof shown in FIGS. 8A and 8B is thinner than the emitter electrode 15*b* (emitter portion 15*c*) near the tip thereof shown in FIGS. 7A and 7B, the radius of curvature at the tip of the emitter electrode 15*b* (emitter portion 15*c*) shown in FIGS. 8A and 8B is larger than that at the tip of the emitter electrode 15*b* (emitter portion 15*c*) shown in FIGS. 7A and 7B. Therefore, the apex angle θ2 at the tip of the emitter electrode 15*b* (emitter portion 15*c*) shown in FIGS. 8A and 8B becomes smaller than the apex angle θ1 at the tip of the emitter electrode 15*b* (emitter portion 15*c*) shown in FIGS. 7A and 7B, and the above-described characteristics are improved.

Figure 9:
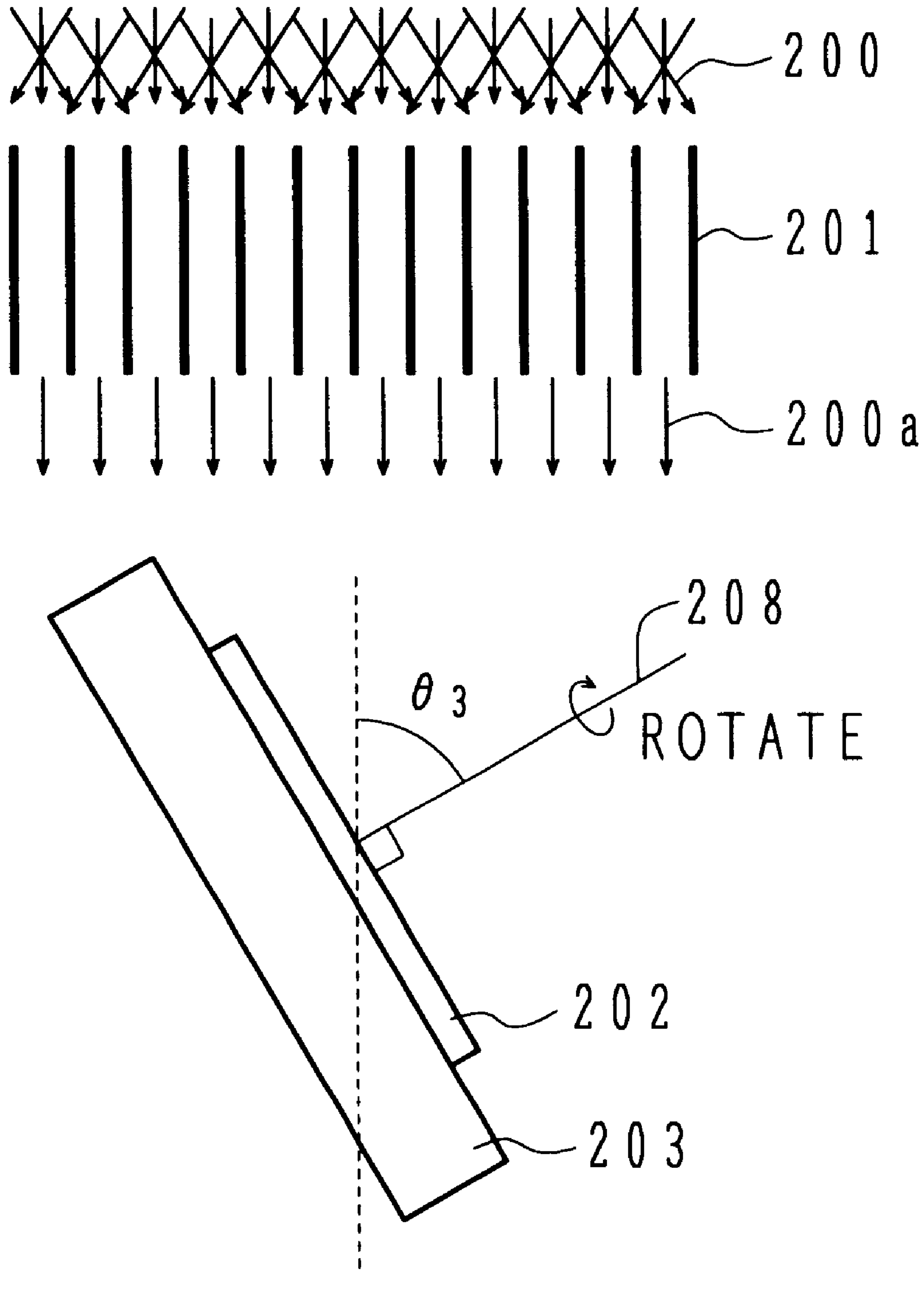
FIG. 9 is a schematic diagram illustrating an oblique sputtering method using a collimator.

FIG. 9 illustrates a method of controlling the step coverage of a film by using an oblique sputtering method with a collimator 201.

If the collimator 201 is not used, sputtered particles 200 scatter and reach a substrate 202 with a wider incidence angle range thereof, as compared to vacuum evaporation which makes particles be incident upon the particle without scattering. Sputtered particles 200 radiated in various directions enter the collimator 201 and are output as sputtered particles 200*a* along a predetermined radiation direction. These sputtered particles aligned in the predetermined radiation direction become incident upon the surface of the substrate 202 supported by a substrate holder 203 at an angle of θ3 relative to the normal 208 to a surface of the substrate 202.

The substrate holder 203 and substrate 202 are rotated by a motor (not shown) about an axis parallel to the normal 208, while the angle θ3 relative to the normal 208 is maintained. Asymmetry of the step coverage of a film to be formed on a surface of a recess of the substrate 202 can therefore be improved.

Figure 10:
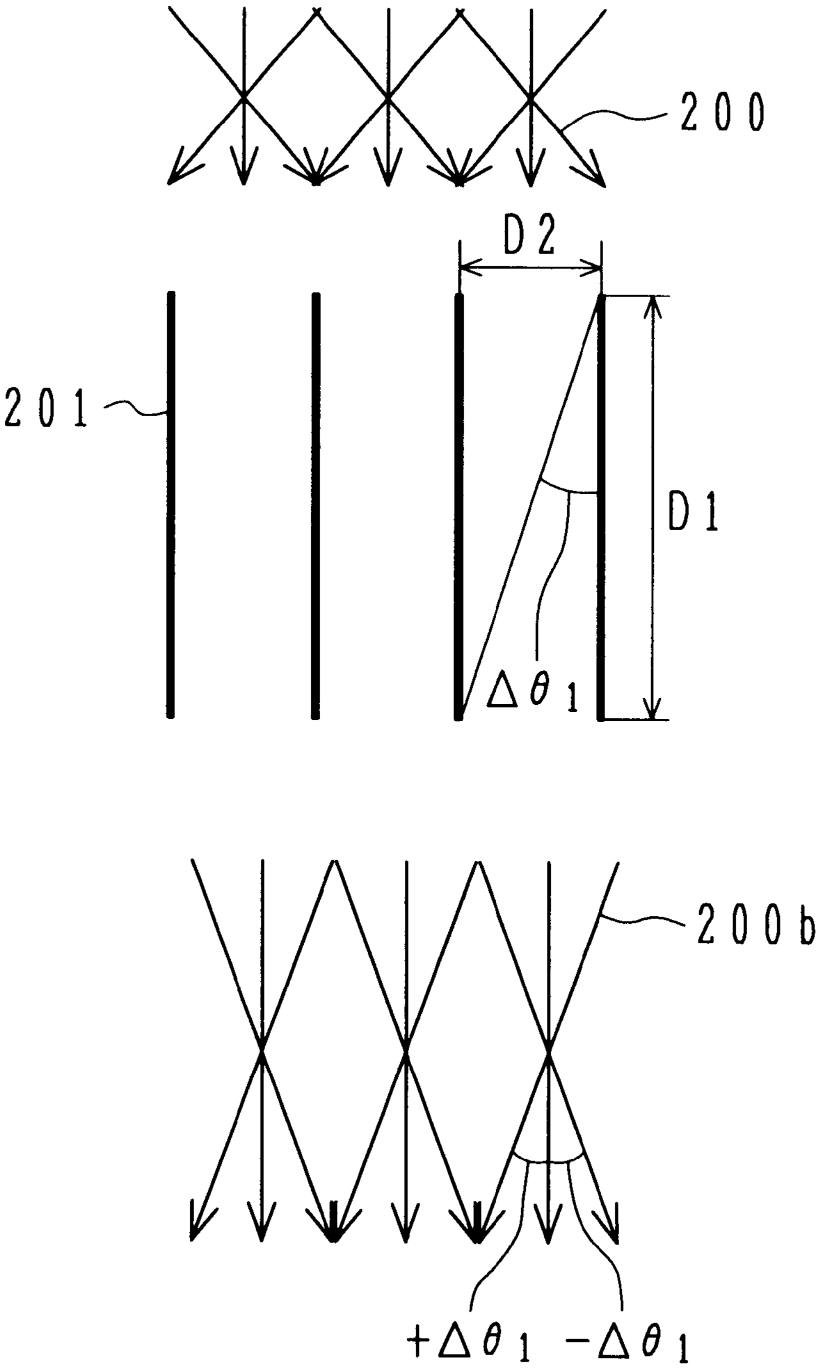
FIG. 10 is a schematic diagram illustrating the details of the oblique sputtering method using a collimator.

FIG. 10 illustrates a more concrete function of the collimator used with the oblique sputtering.

The collimator 201 is made of a plate of metal, ceramic or the like having a thickness of D1, the plate being formed with a number of holes having a diameter of D2. Each hole of the collimator 201 is generally hexagonal in section in order to maximize the rate of the hole area. Many of the collimator 201 have a honeycomb structure. The shape of the hole of the collimator 201 may be circular or polygonal other than hexagonal.

Sputtered particles 200 enter the collimator 201 and are output as sputtered particles 200*b*. The sputtered particles 200*b* have an angle distribution of ±Δθ1 from the incidence angle θ3 (refer to FIG. 9) to the substrate 202. The angle Δθ1 is determined by the thickness of the collimator 201 and the size of the hole formed on the plate and defined by the following equation:

$$\tan \Delta\theta 1 = D2/D1$$

The smaller the thickness D1 of the collimator 201 or the larger the diameter D2 of the hole of the collimator 201, the larger the angle Δθ1.

Figure 11:
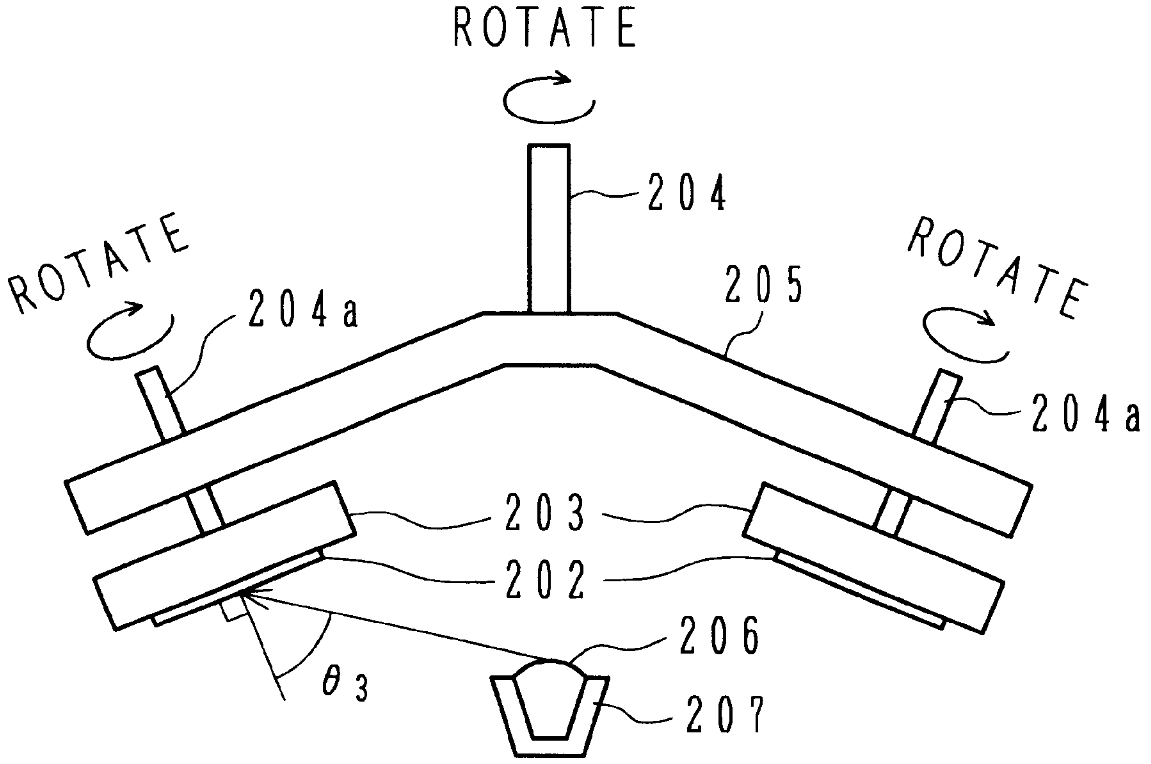
FIG. 11 is a schematic diagram illustrating an oblique evaporation method.

FIG. 11 illustrates a method of controlling the step coverage of a film to be formed by the oblique evaporation method.

An evaporation source (material to be evaporated and deposited) 206 in a boat 207 is heated to evaporate and emit particles from the evaporation source 206. Particles emitted from the evaporation source 206 become incident upon the surface of a substrate 202 supported by a substrate holder 203 at an angle θ3 relative to a normal to a surface of the substrate 202. The substrate holder 203 is rotated by a motor (not shown) about a rotary shaft 204*a* while the angle θ3 is maintained, to rotate the substrate 202.

The rotary shaft 204*a* is rotatively fixed to a planetary 205. The planetary 205 is rotated by a motor (not shown) about a rotary shaft 204. The substrate 202 revolves about the rotary shaft 204. As a result, the uniformness of a film thickness over the whole area of the substrate 202 and a symmertry of the step coverage of a film to be formed on a surface of a recess of the substrate 202 can be improved.

Figure 12A:
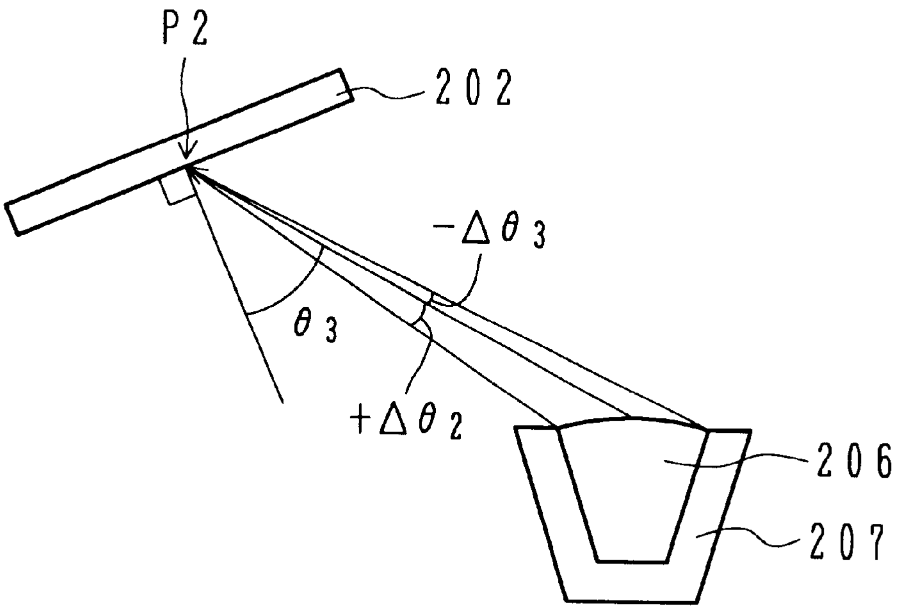
FIGS. 12A and 12B are schematic diagrams illustrating the details of the oblique evaporation method.

FIG. 12A illustrates an incidence angle distribution of particles on the assumption that the evaporation source used by the oblique evaporation method has a definite size.

A particle emitted from the center of an evaporation source (material to be evaporated and deposited) 206 is incident upon the surface of the substrate 202 at the rotary center P2 thereof at an angle θ3 relative to the normal to a surface of the substrate 202. Particles emitted from the other surface of the evaporation source (material to be evaporated and deposited) 206 have an angle distribution of from θ3−Δθ2 to θ3+Δθ3 relative to the normal.

Figure 12B:
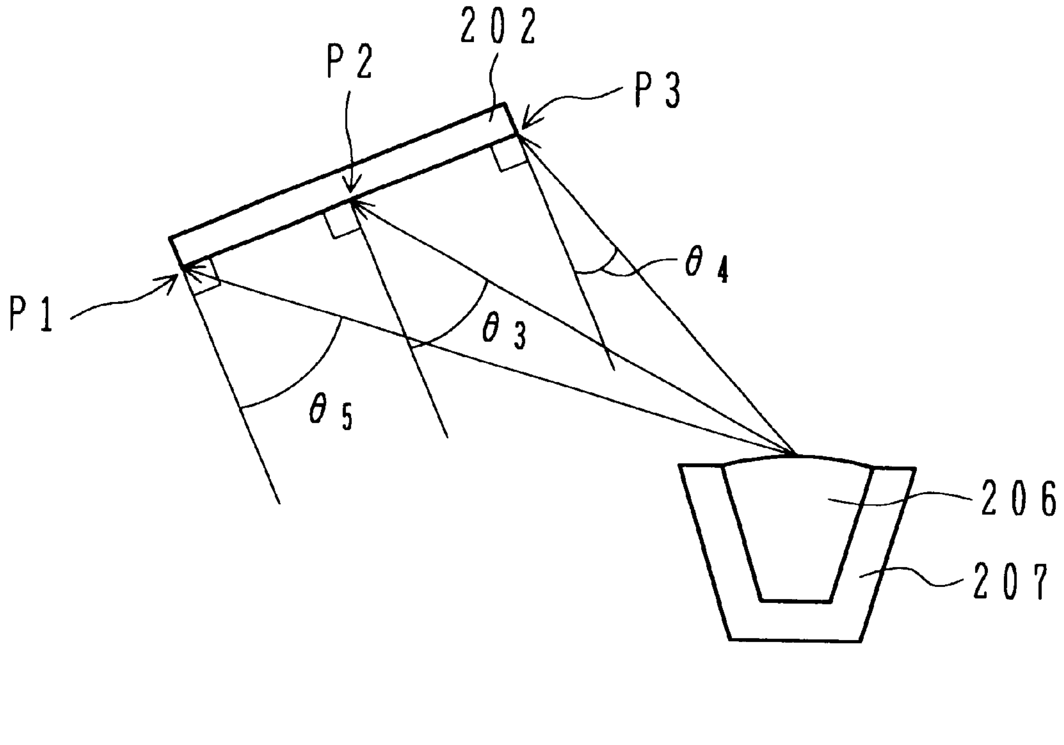

FIG. 12B shows the incidence angle distribution of particles on the assumption that the distance between the evaporation source (material to be evaporated and deposited) 206 used by the oblique evaporation method and the diameter of the substrate is definite.

The incidence angle of the evaporation source 206 relative to the substrate 202 excepting at the rotary center P2 thereof changes with the rotation of the substrate 202 and has an angle distribution. For example, an incidence angle at a position P1 of the substrate 202 remote from the evaporation source 206 is θ5 relative to the normal to a surface of the substrate 202. As the substrate 202 rotates by 180 degrees, the position P1 moves to a position P3 near to the evaporation source 206. The incidence angle at this position P3 is θ4 relative to the normal to the surface of the substrate 202. Although scattering of evaporated particles seldom occurs, a collimator such as shown in FIG. 9 may be disposed between the evaporation source 206 and substrate 202.

Figure 13A:
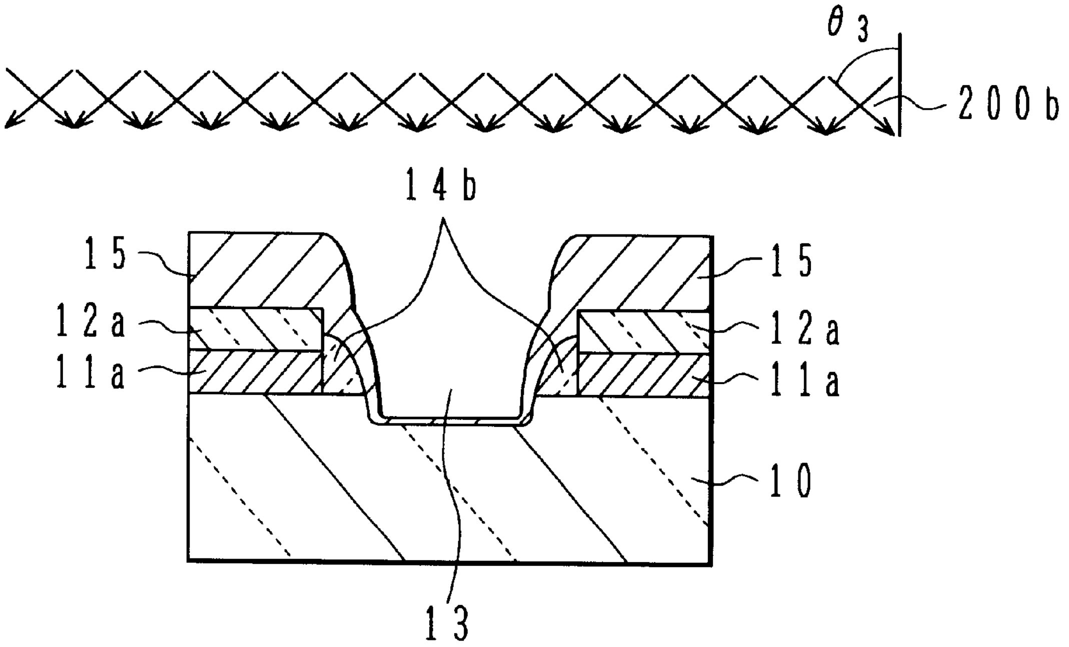
FIGS. 13A and 13B illustrate the manufacture steps of a field emission element according to another modification of the third embodiment.
Figure 13B:
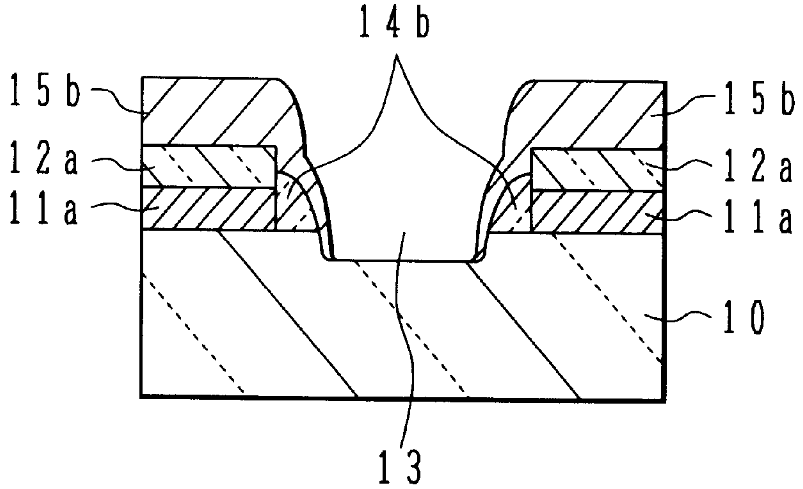

FIGS. 13A and 13B illustrate the manufacture steps of a field emission element according to another modification of the third embodiment.

First, the substrate shown in FIG. 3A is formed.

Next, as shown in FIG. 13A, particles 200*b* are applied to the substrate to form an emitter electrode film 15, by using the oblique sputtering method shown in FIG. 9 or the oblique evaporation method shown in FIG. 11. The particles 200*b* become incident upon the substrate at the incidence angle θ3 relative to the normal to a substrate surface. For example, the emitter electrode film 15 of $TiN_x$ is deposited 0.3 μm thick by reactive sputtering. This reactive sputtering is performed by using a DC sputtering system and Ti as a target while gas of $N_2$+Ar is introduced.

When the incidence angles of particles 200*b* are made uniform, θ3, the shadowing effect of the recess 13 can be enhanced and the emitter electrode film 15 can be made thin at the bottom of the recess 13 and thick at the flat portion. The shadowing effect will be later described with reference to FIGS. 14A and 14B. As described above, with the fixed incidence angle θ3 of particles 200*b*, the emitter electrode film 15 having a poor step coverage can be formed.

Next, a whole surface of the emitter electrode film 15 is etched back by about 0.05 μm thickness.

As shown in FIG. 13B, the emitter electrode film 15 at the bottom of the recess 13 is therefore completely removed and an emitter electrode 15*b* is left on the side wall of the recess 13 and on the first insulating film 12*a*. For example, this etch-back is performed by using a magnetron RIE system through anisotropic dry etching. In this case, $Cl_2$ is used as etching gas and a reaction chamber pressure is set to 125 mTorr.

Thereafter, processes similar to those shown in FIGS. 3D to 3F are preformed to complete a two-electrode element.

Figure 14A:
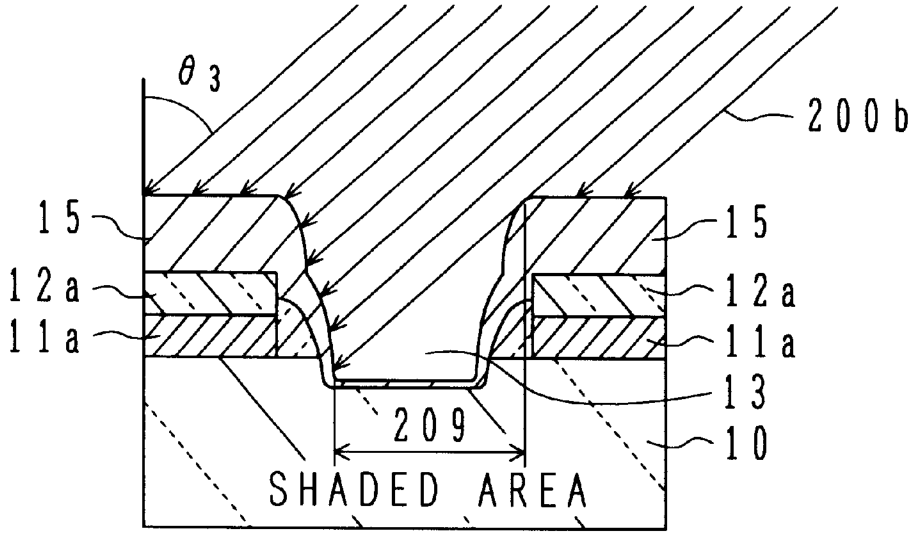
FIGS. 14A and 14B are schematic diagrams illustrating shadowing effects.
Figure 14B:
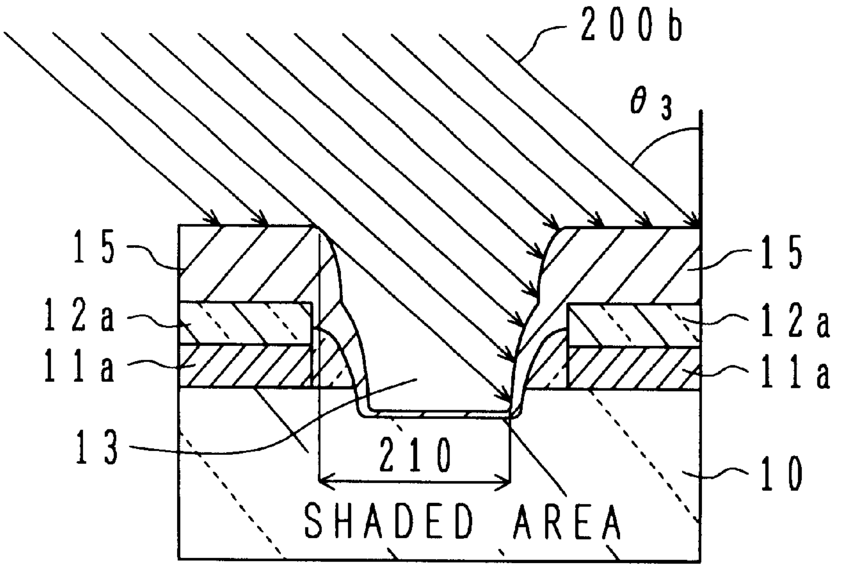

FIGS. 14A and 14B are cross sectional views of a substrate illustrating the shadowing effect.

FIG. 14A shows the deposition state of particles 200*b* on the substrate 202 near at the position P2 shown in FIG. 12B. At the incidence angle θ3 of the particles 200*b* relative to the normal to a substrate surface, a shaded area 209 is formed on the bottom of the recess 13 and on the right side wall (as viewed in FIG. 14A) of the recess 13.

FIG. 14B shows the deposition state of particles 200*b* on the substrate 202 which is revolved by 180 degrees about the planetary rotary shaft and rotated by 180 degrees about its rotary shaft, relative to the position shown in FIG. 14A. The incidence angle θ3 of the particles 200*b* relative to the normal to the substrate surface at the position P2 does not change because the position P2 is the rotary center. However, the shaded area is moved to a shaded area 210 on the bottom of the recess 13 and on the left side wall (as viewed in FIG. 14B) of the recess 13.

As shown in FIG. 12A, the incidence angle of particles relative to the normal to the substrate surface change in a range from θ3−Δθ2 to θ3+Δθ3 relative to the normal to the substrate surface. As shown in FIG. 12B, since the position P1 moves to the position P3 as the substrate rotates by 180 degrees about its rotary shaft, the incidence angle of particles relative to the normal to the substrate surface changes in a range from θ5 to θ4. From the above reasons, particles are deposited thinly also on the shaded areas 209 and 210 shown in FIGS. 14A and 14B, and a thin emitter electrode film 15 can be formed.

Next, with reference to FIGS. 15A to 15C, a method of manufacturing a field emission element (two-electrode element) according to the fourth embodiment of the invention will be described. Also in the fourth embodiment, the gate electrode has first and second gate electrodes.

In the fourth embodiment, processes similar to those of the first embodiment shown in FIGS. 1A to 1C are performed and then processes similar to those of the second embodiment shown in FIGS. 3A to 3D are performed.

In the fourth embodiment, after the process similar to that shown in FIG. 3D is performed, the whole area of the second sacrificial film 16 is etched back.

Figure 15A:
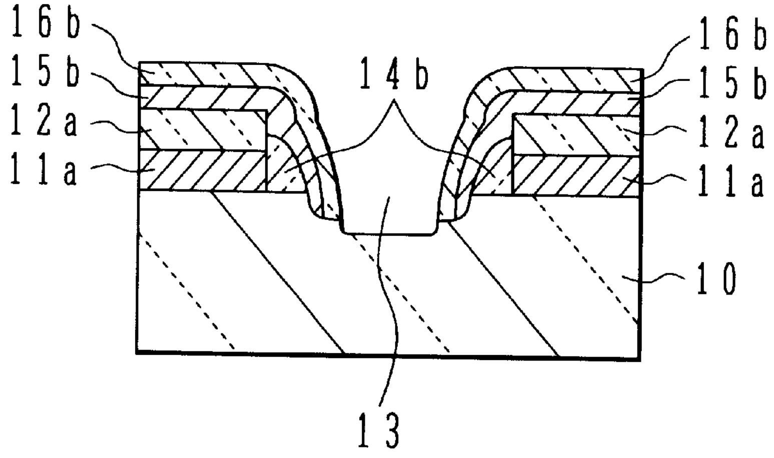
FIGS. 15A to 15C are cross sectional views of a substrate illustrating the manufacture steps of a field emission element according to a fourth embodiment of the invention.

As shown in FIG. 15A, with this etch-back process, the second sacrificial film 16 is completely removed only on the bottom of the recess 13 and the substrate 10 exposed on the bottom of the recess 13 is etched about 0.05 μm deep. The second sacrificial film 16 is not removed completely above the first sacrificial film 12*a* and on the side wall of the recess 13 to leave it as a second sacrificial film 16*b*. This etch-back may be performed by anisotropic dry etching. For example, the anisotropic dry etching is preformed by using a magnetron RIE system and $SF_6$+He as etching gas at a reaction chamber pressure of 125 mTorr.

Figure 15B:
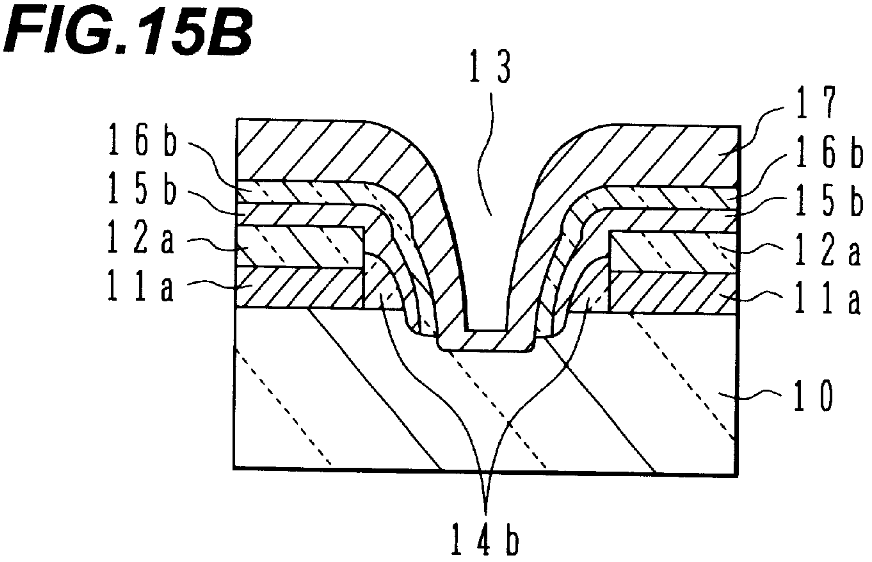

Next, as shown in FIG. 15B, a second gate electrode film 17 made of, for example, $TiN_x$, is deposited to a thickness of 0.2 μm through reactive sputtering over a whole surface of the substrate. This reactive sputtering is performed by using a DC sputtering system and Ti as a target while gas of $N_2$+Ar is introduced.

Figure 15C:
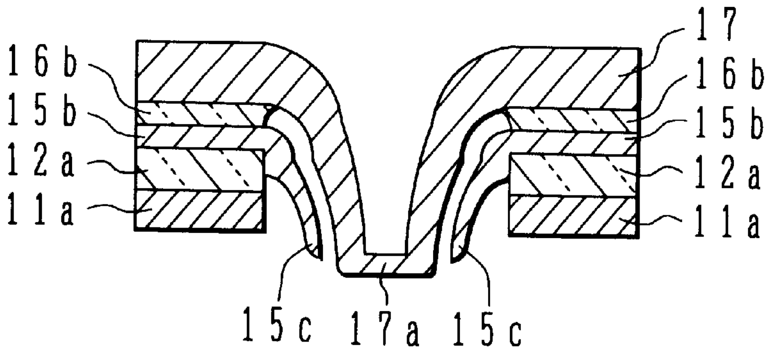

Lastly, as shown in FIG. 15C, all of the substrate 10 and side spacer 14*b* and a portion of the second sacrificial film 16*b* are etched and removed to expose the first gate electrode (converging electrode) 11*a*, second gate electrode 17 (gate portion 17*a*) and emitter electrode 15*b* (emitter portion 15*c*) to thereby complete a two-electrode element.

For etching Si such as the Si substrate, $HF+HNO_3+CH_3COOH$ is used, and for etching the silicon oxide film or the like, $HF+NH_4F$ is used. For etching the silicon nitride film, $H_3PO_4$ heated to a temperature from 160 to 180° C. is used.

The second gate electrode 17 (gate portion 17*a*) extends lower than the emitter electrode 15*b* (emitter portion 15*c*). Therefore, electrons emitted from the emitter electrode 15*b* (emitter portion 15*c*) are likely to be collected in the area near the center axes of the emitter electrode 15*b* (emitter portion 15*c*) and second gate electrode 17 (gate portion 17*a*). Therefore, the spot diameter of electrons emitted from the emitter electrode 15*b* (emitter portion 15*c*) toward an anode electrode (not shown) becomes small. If a flat display panel is formed by using such elements, a high resolution can be achieved. The focusing of the electrons to be radiated on the anode electrode can be performed by controlling voltages to be applied to the first and second gate electrodes 11*a* and 17 relative to the emitter electrode 15*b*.

Figure 16A:
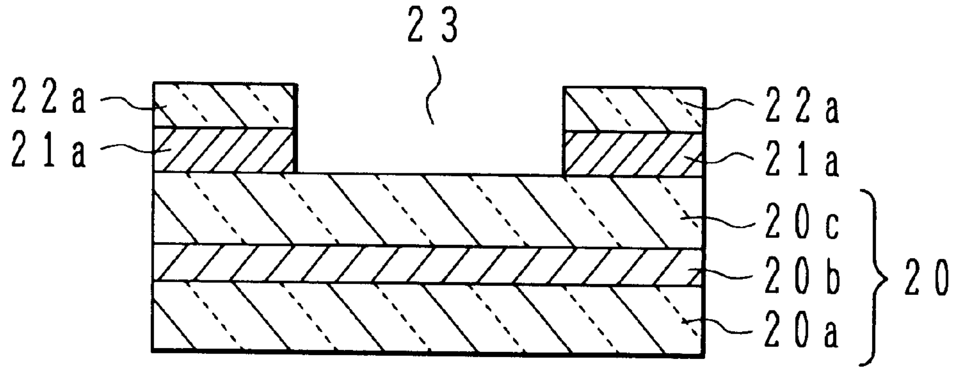
FIGS. 16A to 16I are cross sectional views of a substrate illustrating the manufacture steps of a field emission element (three-electrode element) according to a fifth embodiment of the invention.

Next, with reference to FIGS. 16A to 16I, a method of manufacturing a field emission element (three-electrode element) according to the fifth embodiment of the invention will be described. The three-electrode element of the fifth embodiment has three electrodes, an emitter electrode, a gate electrode and an anode electrode. Also in the this embodiment, the gate electrode has first and second gate electrodes First, a substrate 20 shown in FIG. 16A is formed. The substrate 20 includes a starting substrate 20*a* made of silicon oxide, an anode electrode 20*b* made of polysilicon doped with P or B, and a first sacrificial film (insulating film) 20*c* made of $SIO_2$.

For example, the anode electrode 20*b* is deposited on the starting substrate 20*a* to a thickness of 0.15 μm by sputtering, and the first sacrificial film 20*c* is deposited on the anode electrode 20*b* to a thickness of 0.3 μm by CVD.

Next, on the first sacrificial film 20*c* of the substrate 20, a first gate electrode film 21 made of polysilicon doped with P or B is deposited to a thickness of 0.15 μm by sputtering. On this first gate electrode film 21, a second sacrificial film 22 made of silicon oxide is deposited to a thickness of 0.15 μm.

Next, a resist film (not shown) having a predetermined pattern is formed on the second sacrificial film 22 through photolithography. By using this resist film as a mask, the second sacrificial film 22 and first gate electrode film 21 are anisotropically etched.

As shown in FIG. 16A, a second sacrificial film 22*a* and a first gate electrode 21a having a predetermined pattern and a recess 23 are therefore left. The recess 23 has a generally vertical side wall whose plan shape (as viewed downward) is a circle of 0.6 μm diameter and height is about 0.3 μm. A portion of the recess 23 corresponding to the first gate electrode 21*a* forms a gate hole.

For example, this etching is performed by using a magnetron RIE system and HBr as etching gas at a reaction chamber pressure of 100 mTorr.

Figure 16B:
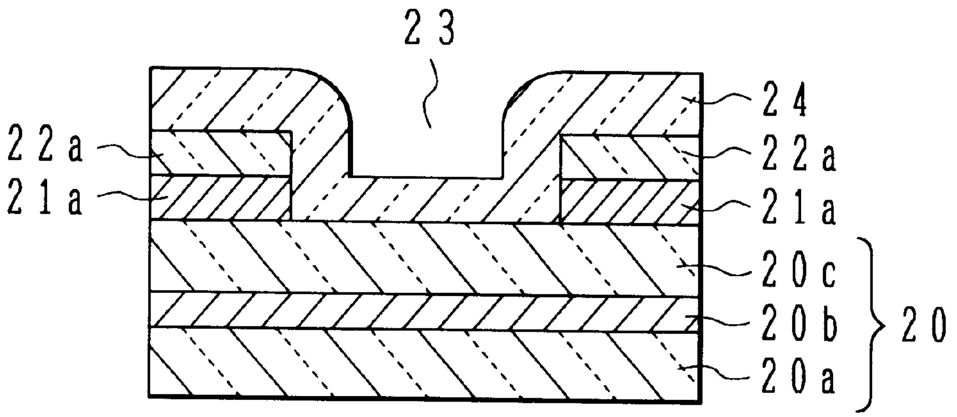

Next, as shown in FIG. 16B, an Si oxide film is deposited on the second sacrificial film 22*a* and recess 23 to a thickness of 0.2 μm through atmospheric pressure CVD to form a third sacrificial film 24. For example, the third sacrificial film 24 is formed under the conditions of a substrate temperature of 400°C. and source gas of $O_3$ and TEOS.

Next, the third sacrificial film 24 is anisotropically dry etched (etched back).

Figure 16C:
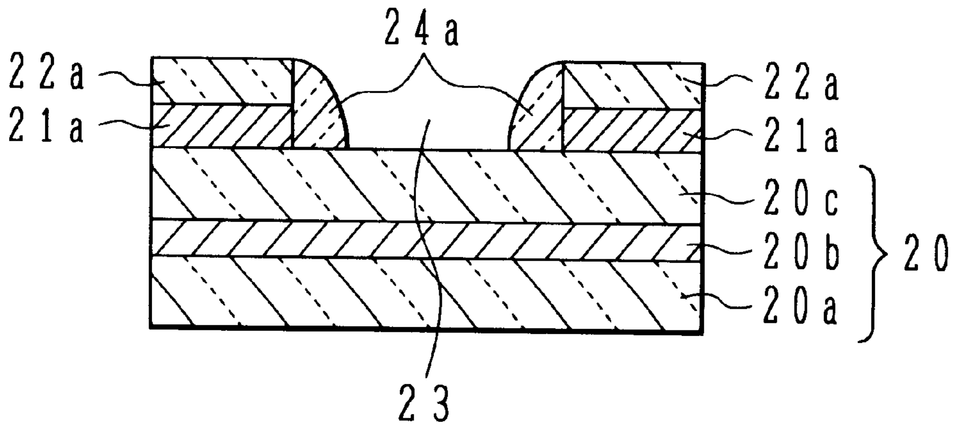

As shown in FIG. 16C, a portion of the third sacrificial film 24 is therefore left only on the side wall and partial bottom surface of the recess 23, as a side spacer 24*a*.

Figure 16D:
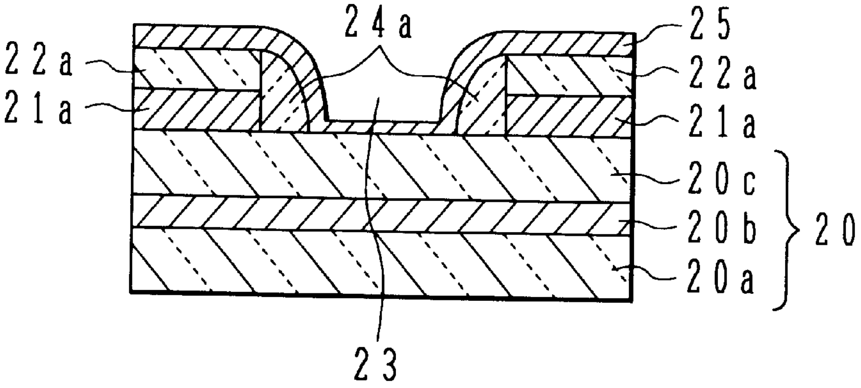

Next, as shown in FIG. 16D, an emitter electrode film 25 made of, for example, $TiN_x$, is deposited to a thickness of 0.1 μm (as measured relative to the second sacrificial film 22*a*) by using a DC sputtering system, on the surfaces of the substrate 20 exposed at the bottom of the recess 23, of the side spacer 24*a* and of the second sacrificial film 22*a*. This sputtering is performed by using Ti as a target while gas of $N_2$+Ar is introduced.

Figure 16E:
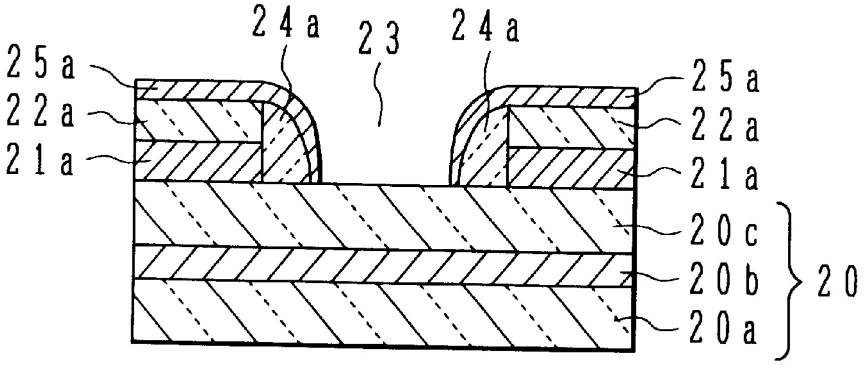

Next, as shown in FIG. 16E, the whole area of the emitter electrode film 25 is etched back by about 0.05 μm to completely remove it on the bottom of the recess 23 and leave it on the second sacrificial film 22*a* and side wall of the recess 23 as an emitter electrode 25*a*. For this etch-back, anisotropical dry etching is performed. For example, it is performed by using a magnetron RIE system at a reaction chamber pressure of 125 mTorr by using $Cl_2$ as etching gas.

Figure 16F:
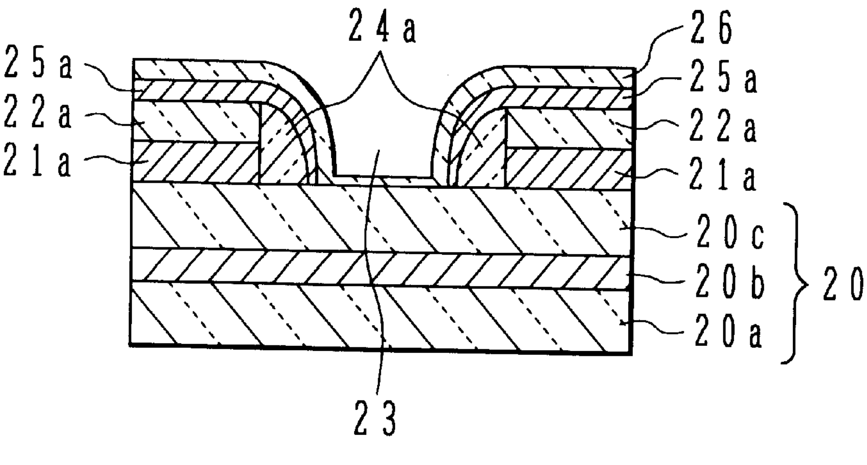

Next, as shown in FIG. 16F, a fourth sacrificial film (insulating film) 26 made of Si oxide is deposited on a whole surface of the substrate to a thickness of 0.1 μm by atmospheric pressure CVD. For example, this film is formed under the conditions of source gas of $O_3$ and TEOS and a substrate temperature of 400° C.

Figure 16G:
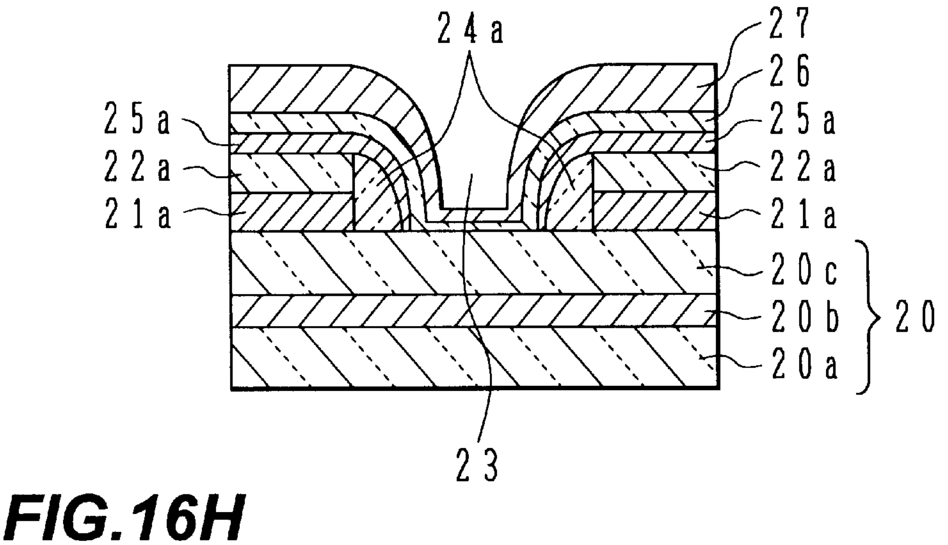

Next, as shown in FIG. 16G, a second gate electrode film 27 made of, for example, $TiN_x$, is deposited on the surface of the fourth sacrificial film 26 to a thickness of 0.2 μm through reactive sputtering. This reactive sputtering is performed by using a DC sputtering system and Ti as a target while gas of $N_2$+Ar is introduced.

A resist mask (not shown) is formed on the second gate electrode film 27 by using ordinary photolithography, and a region of the second gate electrode film 27 not used as the gate portion is removed.

Figure 16H:
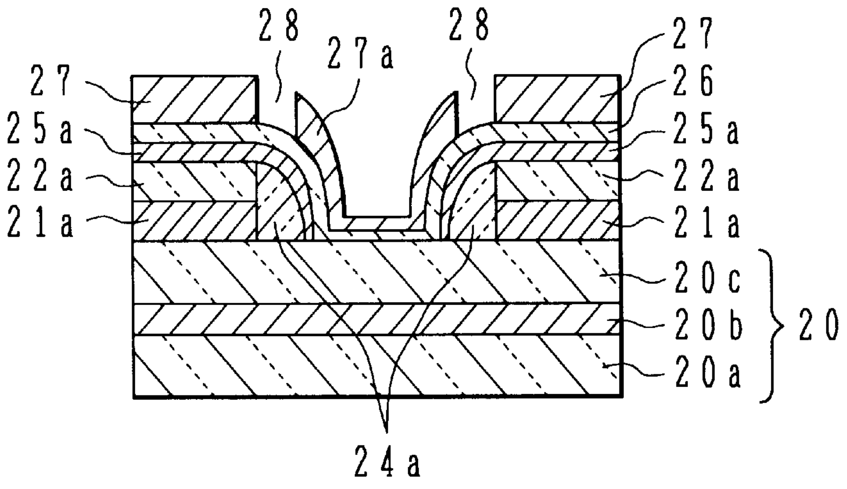

As shown in FIG. 16H, two slit openings 28 and a gate portion 27*a* are therefore formed. This etching is performed by anisotropic dry etching. For example, it is performed by using a magnetron RIE system at a reaction chamber pressure of 125 mTorr by using $Cl_2$ as etching gas.

Next, a portion of the first sacrificial film 20*c*, a portion or the whole of the side spacer 24*a*, and a portion of the fourth sacrificial film 26 are removed isotropically by wet etching via the slit openings 28.

Figure 16I:
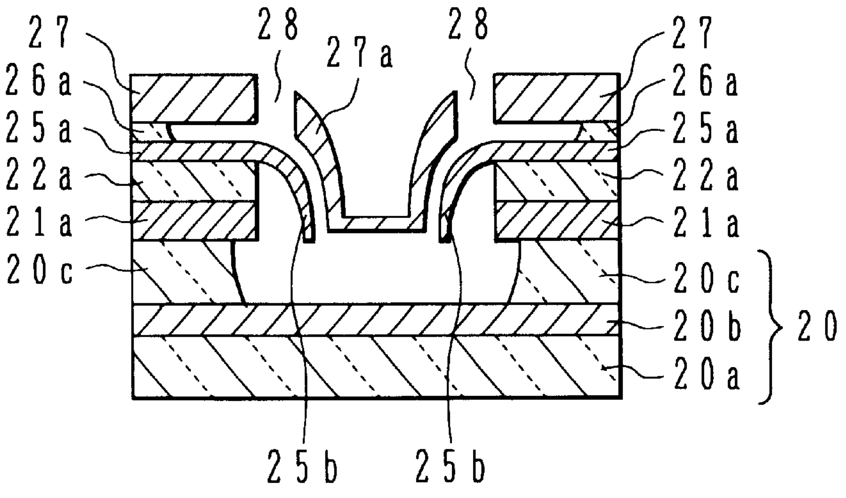

As shown in FIG. 16I, the gate portion 27*a*, a portion of the first gate electrode 21*a*, the emitter electrode 25*a* (emitter portion 25*b*) and a portion of the anode electrode 20*b* are therefore exposed to complete a three-electrode element. For etching $SiO_2$, HF+$NH_4F$ is used.

Figure 17A:
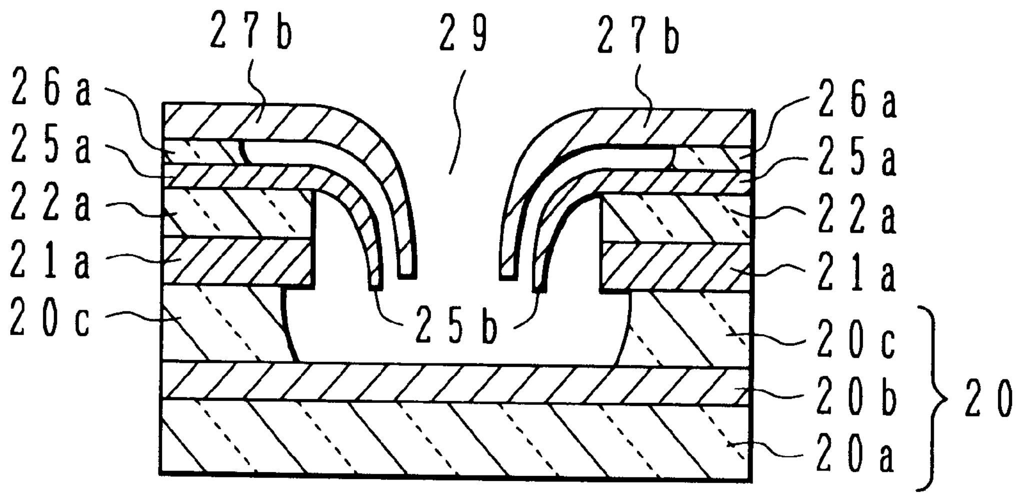
FIGS. 17A and 17B are cross sectional views of field emission elements according to modifications of the fifth embodiment.
Figure 17B:
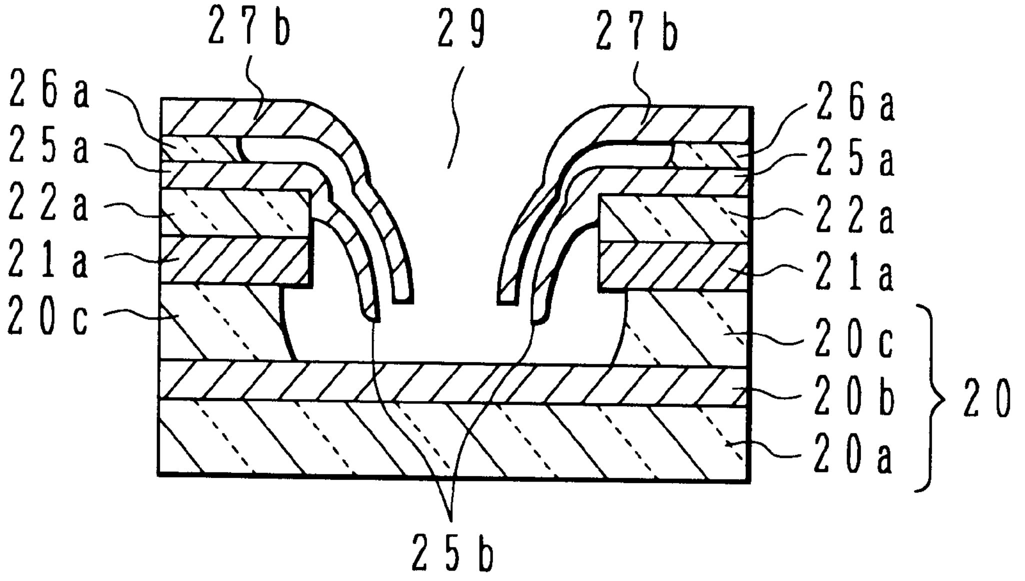

FIGS. 17A and 17B are cross sectional views showing modifications of the fifth embodiment.

In the modification shown in FIG. 17A, processes similar to those shown in FIGS. 16A to 16G are performed. In this modification, a slit opening used for removing unnecessary regions is formed without incorporating photolithography. After the process shown in FIG. 16G, the whole area of the second gate electrode film 27 is etched back to remove the second gate electrode film 27 at the bottom of the recess 23 to leave the second gate electrode 27*b* having an opening 29. This etching is performed by anisotropic dry etching. For example, it is performed by using a magnetron RIE system at a reaction chamber pressure of 125 mTorr by using $Cl_2$ as etching gas. In this modification, a silicon nitride film is used as the second sacrificial film 22*a*.

Also in the modification shown in FIG. 17B, a silicon nitride film is used as the second sacrificial film 22*a*. First, processes similar to those shown in FIGS. 16A and 16B are performed. Next, the third sacrificial film 24 is etch-backed to form the side spacer. In this etch-back process, similar to the process of the second embodiment shown in FIG. 3A, the first sacrificial film 20*c* of the substrate 20 is over-etched to some depth. Thereafter, processes similar to those shown in FIGS. 3B to 3E are performed.

Then, similar to the modification shown in FIG. 17A, the second gate electrode film 27 is etched and removed at the bottom of the recess 13 (refer to FIG. 3E) to form the second gate electrode 27*b* having an opening 29. Thereafter, a portion of the first sacrificial film 20*c*, a portion or the whole of the side spacer 24*a*, and a portion of the fourth sacrificial film 26 are removed isotropically by wet etching via the opening 29. Portions of the second gate electrode 27*b* and first gate electrode 21*a*, the emitter electrode 25*a* (emitter portion 25*b*) and a portion of the anode electrode 20*b* are exposed to complete a three-electrode element. As seen from FIG. 17B, also in this modification, the tip of the emitter electrode 25*a* (emitter portion 25*b*) can be sharpened.

Figure 18:
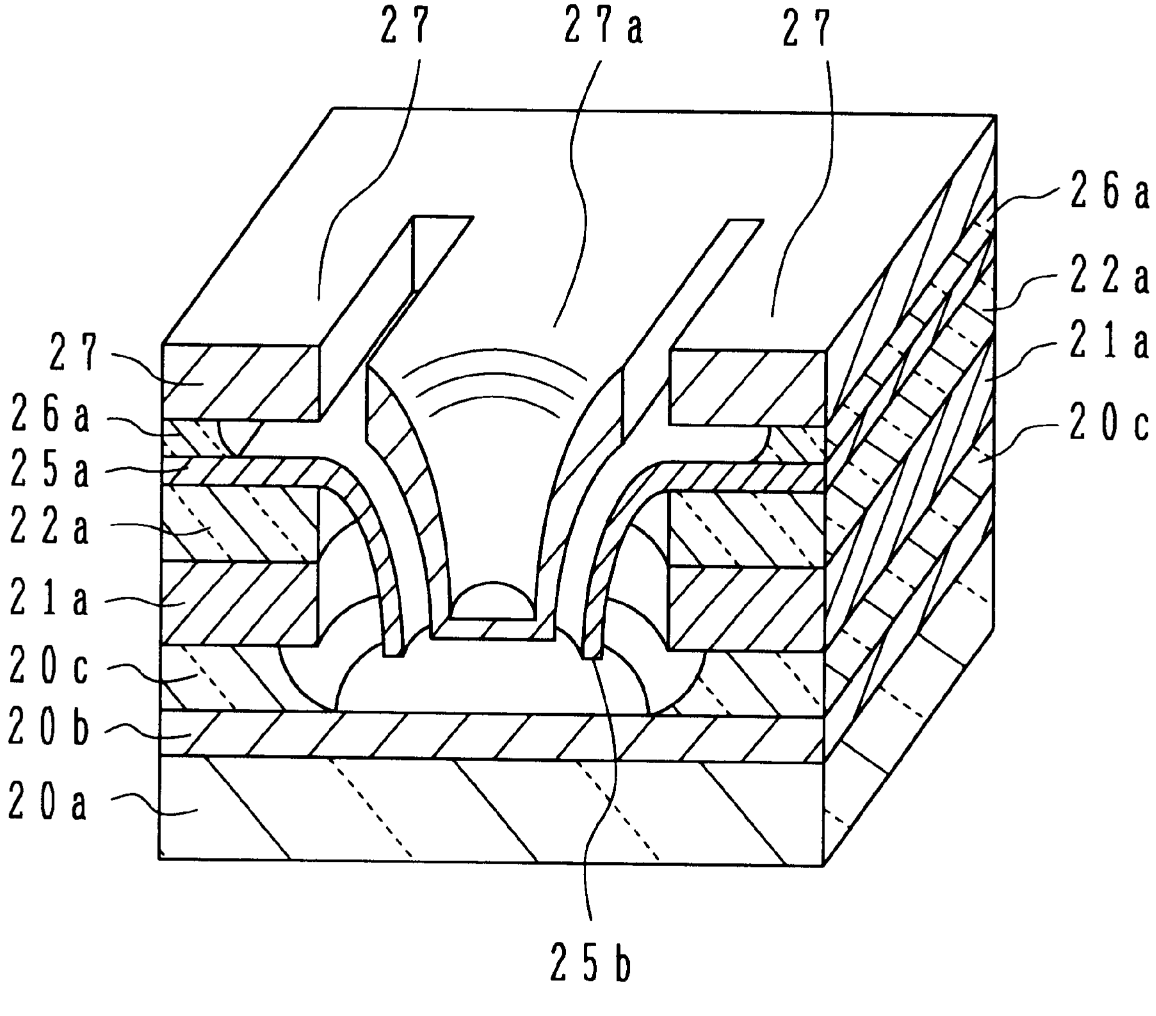
FIG. 18 is a perspective view of a field emission element according to an embodiment of the invention.

FIG. 18 is a perspective view of the three-electrode element of the fifth embodiment shown in FIG. 16I. The gate portion 27*a* is connected and supported by the second gate electrode 27. The tip of the emitter electrode 25*a* (emitter portion 25*b*) is positioned inside of the gate hole of the first gate electrode 21*a*, and has a circular hole. The emitter portion 25*b* has a shape like a crater. The top end of the gate portion 27*a* is positioned being slightly retracted from the top end of the emitter portion 25*b*.

The three-electrode element has an emitter electrode 25*a* as a cathode and an anode electrode 20*b* as a plate. By applying predetermined potentials to the first and second gate electrodes 21*a* and 27, a converged electron beam can be emitted from the emitter electrode 25*a* (emitter portion 25*b*) toward the anode electrode 20*b*.

Figure 19:
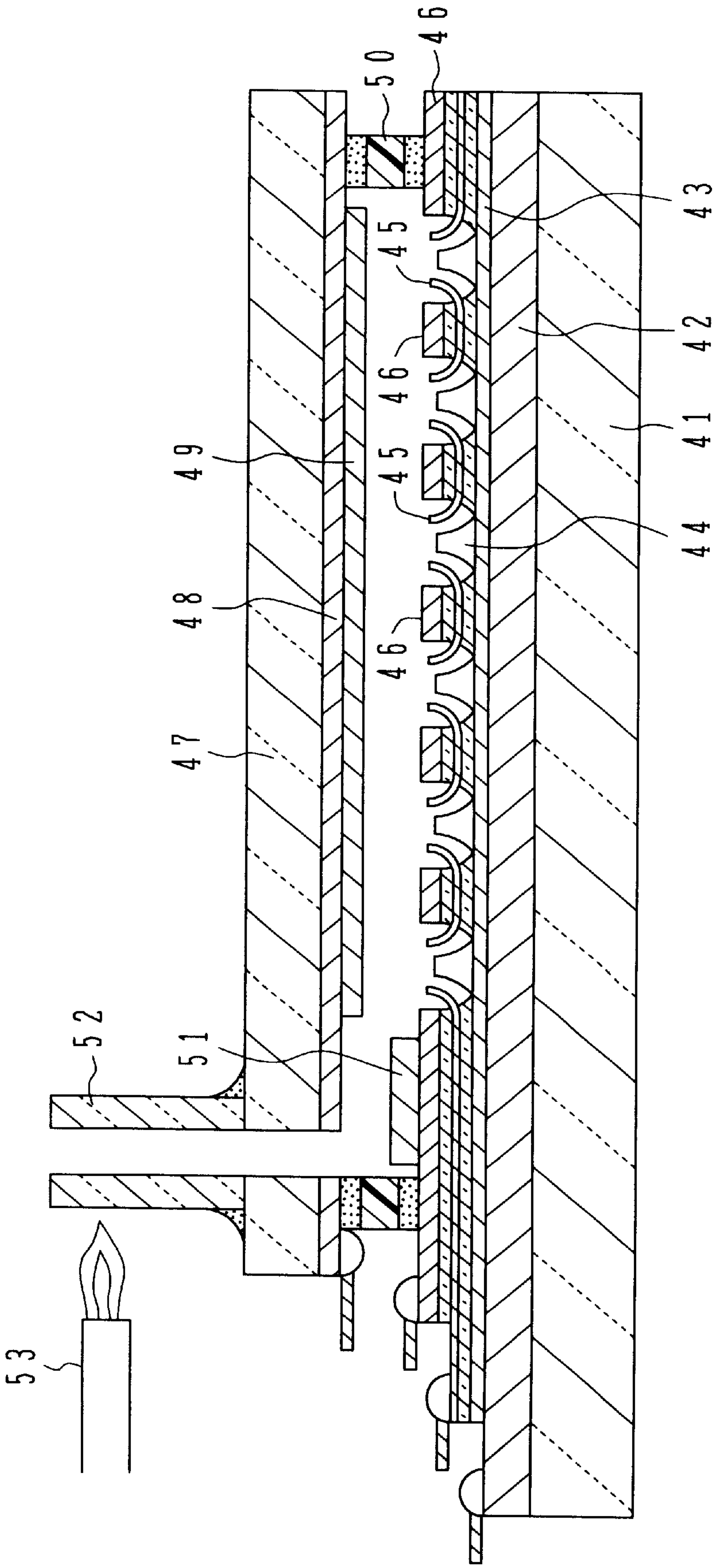
FIG. 19 is a cross sectional view of a flat display panel using field emission elements.

FIG. 19 is a cross sectional view of a flat panel display using field emission elements.

The field emission elements are two-electrode elements manufactured by the first embodiment method. Formed on a support substrate 41 made of insulating material, are a wiring layer 42 made of Al, Cu, or the like and a resistor layer 43 made of polysilicon or the like. On the resistor layer 43, a number of second gate electrodes (gate portions) 44 and emitter electrodes (emitter portions) 45 of a crater shape are disposed to form a field emitter array (FEA). Each of the first gate electrodes 46 has a small opening (gate hole) near at the tip of each emitter electrode 45 and a voltage can be applied independently to each gate electrode although not shown. A plurality of emitter electrodes 45 can also be independently applied with a voltage.

Facing electron sources including the emitter electrodes 45 and first and second gate electrodes 46 and 44, an opposing substrate including a transparent substrate 47 made of glass, quartz, or the like is disposed. The opposing substrate has a transparent electrode (anode electrode) 48 made of ITO or the like disposed under the transparent substrate 47 and a fluorescent member 49 disposed under the transparent electrode 48.

The electron sources and opposing substrate are joined together via a spacer 50 made of a glass substrate and coated with adhesive, with the distance between the transparent electrode 48 and emitter electrode 45 being maintained about 0.1 to 5 mm. The adhesive may be low melting point glass.

Instead of the spacer 50 of a glass substrate, a spacer 50 made of adhesive such as epoxy resin with glass beads being dispersed therein may be used.

A getter member 51 is disposed at proper positions of FEA. The getter member 51 is made of Ti, Al, Mg, or the like and prevents emitted gas from attaching again to the surface of the emitter electrode 45.

An air exhaust pipe 52 is coupled to the opposing substrate. By using this air exhaust pipe 52, the inside of the flat display panel is evacuated to about $10^{-5}$ to $10^{-9}$ Torr, and then the air exhaust pipe 52 is sealed by using a burner 53 or the like. Thereafter, the anode electrode (transparent electrode) 48, emitter electrode 45, first and second gate electrodes 46 and 44 are wired to complete the flat panel display.

The anode electrode (transparent electrode) 48 is always maintained at a positive potential. Each display pixel is two-dimensionally selected by an emitter wiring and a gate wiring. Namely, a field emission element disposed at a cross point between the emitter wiring and gate wiring applied with voltages can be selected.

As a negative potential (or ground potential) is applied to the emitter electrode 45 and a positive potential is applied to the second gate electrode 44, electrons are emitted from the emitter electrode 45 toward the anode electrode 48. As electrons bombard upon the fluorescent member 49, the pixel in the bombard area emits light.

The material of the first and second gate electrodes and the emitter electrode may be semiconductor such as polysilicon and amorphous silicon, silicide such as $WSi_x$, $TiSi_x$ and $MoSi_x$, metal such as Al, Cu, W, Mo, Ni, Cr and Hf, conductive nitride such as $TiN_x$, or the like.

As the sacrificial film, insulating film and side spacer, a silicon nitride film, a silicon oxide film, a silicon oxynitride film, or the like may be used.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a field emission element, comprising the steps of:

(a) forming a stacked layer on a substrate, the stacked layer including a first gate electrode with a gate hole and an insulating film with a hole communicating with the gate hole;

(b) forming a side spacer made of insulating material on side walls of the gate hole and the hole to form an emitter portion forming recess, the emitter portion forming recess having a bottom defined by a surface of the substrate exposed via the gate hole and the hole and a side wall surface wholly or partially defined by a surface of the side spacer;

(c) depositing an emitter electrode film covering a surface of the emitter portion forming recess and an upper surface of the stacked layer;

(d) forming an emitter electrode having an emitter portion by removing the emitter electrode film on the bottom of the emitter portion forming recess, the emitter portion being made of the emitter electrode film deposited on the side wall surface of the emitter portion forming recess;

(e) depositing a sacrificial film on a surface of the emitter electrode and on a bottom of the emitter portion forming recess;

(f) depositing a second gate electrode film on a surface of the sacrificial film; and (g) exposing the gate hole and the emitter portion and removing a portion of the sacrificial film deposited on the surface of the emitter portion forming recess.

2. A method of manufacturing a field emission element according to claim 1, wherein said step (e) deposits the sacrificial film thinner on the bottom of the emitter portion forming recess than on the surface of the emitter electrode.

3. A method of manufacturing a field emission element according to claim 1, wherein said step (g) wet-etches and removes the substrate and the side spacer to expose the gate hole and the emitter portion and wet-etch and remove also the sacrificial film deposited on the surface of the emitter portion forming recess.

4. A method of manufacturing a field emission element according to claim 1, wherein said step (c) forms the emitter electrode film having a thickness on the bottom of the emitter portion forming recess smaller than on other areas.

5. A method of manufacturing a field emission element according to claim 4, wherein the emitter electrode film is formed by an oblique sputtering method using a collimator or an oblique evaporation method using a collimator.

6. A method of manufacturing a field emission element according to claim 4, wherein said step (d) etches back the whole surface area of the emitter electrode film to remove the emitter electrode film on the bottom of the emitter portion forming recess.

7. A method of manufacturing a field emission element according to claim 1, further comprising a step of:

(i) adhering a support substrate on the second gate electrode film, after said step (f) and before said step (g).

8. A method of manufacturing a field emission element according to claim 7, wherein said step (i) further comprises a subsidiary step of planarizing a surface of the second gate electrode film with a recessed area above the emitter portion forming recess by using a planarizing film and a subsidiary step of adhering the support substrate to the second gate electrode film and the planarizing film.

9. A method of manufacturing a field emission element according to claim 7, wherein said step (i) further comprises a subsidiary step of coating adhesive on the surface of the second gate electrode film and a subsidiary step of adhering the support substrate to the second gate electrode film with the adhesive.

10. A method of manufacturing a field emission element according to claim 1, wherein said step (b) further comprises a first subsidiary step of depositing a sacrificial film on the surface of the substrate exposed via the gate hole and the hole and on the upper surface of the stacked layer and a second subsidiary step of anisotropically etching back the sacrificial film to form the side spacer.

11. A method of manufacturing a field emission element according to claim 10, wherein said second subsidiary step etches also the surface of the substrate exposed via the gate hole and the hole to form a recess in the substrate.

12. A method of manufacturing a field emission element according to claim 11, wherein the recess has a rounded bottom corner.

13. A method of manufacturing a field emission element according to claim 1, further comprising a step of:

(h) removing the sacrificial film deposited on the bottom of the emitter portion forming recess, after said step (e) and before said step (f).

14. A method of manufacturing a field emission element according to claim 13, wherein when the sacrificial film deposited on the bottom of the emitter portion forming recess is removed, the substrate under the emitter portion forming recess is also etched to from a recess in the substrate.

15. A method of manufacturing a field emission element according to claim 14, wherein said step (f deposits the second gate electrode film also on a surface of the recess.

16. A method of manufacturing a field emission element according to claim 1, wherein the substrate has a starting substrate, an anode electrode formed on a principal surface of the starting substrate, and an electrically insulating film formed on a surface of the anode electrode.

17. A method of manufacturing a field emission element according to claim 16, wherein said step (g) further comprises a first subsidiary step of forming an opening through the second gate electrode film and a second subsidiary step of wet-etching and removing the sacrificial film formed by said step (e), the side spacer, and the electrically insulating film of the substrate, via the opening, to expose the gate hole and the emitter portion and wet-etch and remove also the sacrificial film deposited on the surface of the emitter portion forming recess.

18. A method of manufacturing a field emission element according to claim 17, wherein the first subsidiary step forms the opening through the second gate electrode film in an inner or outer periphery of an area of the emitter portion as viewed in plan.

19. A method of manufacturing a field emission element according to claim 16, further comprising a step of:

(j) removing the second gate electrode film deposited on the sacrificial film above the bottom of the emitter portion forming recess to form an opening through the second gate electrode film, after said step (f) and before said step (9).

20. A method of manufacturing a field emission element according to claim 19, wherein said step (g) wet-etches and removes the sacrificial film formed by said step (e), the side spacer, and the electrically insulating film of the substrate, via the opening, to expose the gate hole and the emitter portion and wet-etch and remove also the sacrificial film deposited on the surface of the emitter portion forming recess.

* * * * *